United States Patent
Yu et al.

(10) Patent No.: US 9,935,090 B2
(45) Date of Patent: Apr. 3, 2018

(54) SUBSTRATE DESIGN FOR SEMICONDUCTOR PACKAGES AND METHOD OF FORMING SAME

(71) Applicant: Taiwan Semiconductor Manufacturing Company, Ltd., Hsin-Chu (TW)

(72) Inventors: Chen-Hua Yu, Hsin-Chu (TW); Jung Wei Cheng, Hsin-chu (TW); Tsung-Ding Wang, Tainan (TW); Chien-Hsun Lee, Chu-tung Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/622,517

(22) Filed: Feb. 13, 2015

(65) Prior Publication Data

US 2015/0235936 A1   Aug. 20, 2015

Related U.S. Application Data

(63) Continuation-in-part of application No. 14/181,305, filed on Feb. 14, 2014.

(51) Int. Cl.
*H01L 25/00* (2006.01)
*H01L 23/498* (2006.01)
(Continued)

(52) U.S. Cl.
CPC .............. *H01L 25/50* (2013.01); *H01L 23/13* (2013.01); *H01L 23/3128* (2013.01);
(Continued)

(58) Field of Classification Search
CPC . H01L 21/561; H01L 21/563; H01L 21/4853; H01L 21/5385; H01L 21/76802; H01L 21/56; B81B 7/02
See application file for complete search history.

(56) References Cited

U.S. PATENT DOCUMENTS

| 4,728,751 A | 3/1988 | Canestaro et al. |
| 4,811,082 A | 3/1989 | Jacobs et al. |

(Continued)

FOREIGN PATENT DOCUMENTS

| JP | 2008103536 A | 5/2008 |
| JP | 4339309 B2 | 10/2009 |

(Continued)

OTHER PUBLICATIONS

Ranganathan, N., et al., •Integration of High Aspect Ratio Tapered Silicon Via for Through-Silicon Interconnection,• 58th Electronic Components and Technology Conference, ECTC 2008., May 2008, pp. 859-865, IEEE, Lake Buena Vista, Florida, United States.

(Continued)

*Primary Examiner* — Kenneth Parker
*Assistant Examiner* — Fang-Xing Jiang
(74) *Attorney, Agent, or Firm* — Slater Matsil, LLP

(57) ABSTRACT

An embodiment device includes a first die, a first molding compound extending along sidewalls of the first die, and one or more first redistribution layers (RDLs) on the first die and the first molding compound. The device further includes a device package comprising a plurality of second dies, wherein the device package is bonded to an opposing surface of the one or more first RDLs as the first die and the first molding compound. A package substrate is bonded to the opposing surface of the one or more first RDLs. The package substrate is electrically connected to the first die and the plurality of second dies.

20 Claims, 26 Drawing Sheets

(51) Int. Cl.

| | | |
|---|---|---|
| *H01L 25/065* | (2006.01) | |
| *H01L 23/13* | (2006.01) | |
| *H01L 23/36* | (2006.01) | |
| *H01L 23/367* | (2006.01) | |
| *H01L 23/538* | (2006.01) | |
| *H01L 23/00* | (2006.01) | |
| *H01L 23/31* | (2006.01) | |
| *H01L 21/56* | (2006.01) | |

(52) U.S. Cl.
CPC .......... *H01L 23/36* (2013.01); *H01L 23/3675* (2013.01); *H01L 23/49816* (2013.01); *H01L 23/49894* (2013.01); *H01L 23/5385* (2013.01); *H01L 23/5389* (2013.01); *H01L 24/19* (2013.01); *H01L 24/96* (2013.01); *H01L 24/97* (2013.01); *H01L 25/0652* (2013.01); *H01L 21/568* (2013.01); *H01L 2224/12105* (2013.01); *H01L 2224/16227* (2013.01); *H01L 2224/32225* (2013.01); *H01L 2224/32245* (2013.01); *H01L 2224/73204* (2013.01); *H01L 2224/73253* (2013.01); *H01L 2224/73267* (2013.01); *H01L 2224/92125* (2013.01); *H01L 2224/97* (2013.01); *H01L 2924/15151* (2013.01); *H01L 2924/15153* (2013.01); *H01L 2924/15159* (2013.01); *H01L 2924/15311* (2013.01); *H01L 2924/16235* (2013.01); *H01L 2924/16251* (2013.01); *H01L 2924/18162* (2013.01)

(56) References Cited

U.S. PATENT DOCUMENTS

| | | | |
|---|---|---|---|
| 4,990,462 | A | 2/1991 | Sliwa, Jr. |
| 5,075,253 | A | 12/1991 | Sliwa, Jr. |
| 5,380,681 | A | 1/1995 | Hsu |
| 5,481,133 | A | 1/1996 | Hsu |
| 5,818,404 | A | 10/1998 | Lebby et al. |
| 5,895,978 | A | 4/1999 | Palagonia |
| 6,002,177 | A | 12/1999 | Gaynes et al. |
| 6,025,648 | A | 2/2000 | Takahashi et al. |
| 6,187,678 | B1 | 2/2001 | Gaynes et al. |
| 6,229,216 | B1 | 5/2001 | Ma et al. |
| 6,236,115 | B1 | 5/2001 | Gaynes et al. |
| 6,271,059 | B1 | 8/2001 | Bertin et al. |
| 6,271,469 | B1 * | 8/2001 | Ma .......... H01L 21/56 174/521 |
| 6,279,815 | B1 | 8/2001 | Correia et al. |
| 6,355,501 | B1 | 3/2002 | Fung et al. |
| 6,434,016 | B2 | 8/2002 | Zeng et al. |
| 6,448,661 | B1 | 9/2002 | Kim et al. |
| 6,461,895 | B1 | 10/2002 | Liang et al. |
| 6,562,653 | B1 | 5/2003 | Ma et al. |
| 6,570,248 | B1 | 5/2003 | Ahn et al. |
| 6,600,222 | B1 | 7/2003 | Levardo |
| 6,603,072 | B1 | 8/2003 | Foster et al. |
| 6,607,938 | B2 | 8/2003 | Kwon et al. |
| 6,661,085 | B2 | 12/2003 | Kellar et al. |
| 6,762,076 | B2 | 7/2004 | Kim et al. |
| 6,790,748 | B2 | 9/2004 | Kim et al. |
| 6,791,195 | B2 | 9/2004 | Urushima |
| 6,879,041 | B2 | 4/2005 | Yamamoto et al. |
| 6,887,769 | B2 | 5/2005 | Kellar et al. |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,975,016 | B2 | 12/2005 | Kellar et al. |
| 7,037,804 | B2 | 5/2006 | Kellar et al. |
| 7,056,807 | B2 | 6/2006 | Kellar et al. |
| 7,087,538 | B2 | 8/2006 | Staines et al. |
| 7,098,542 | B1 | 8/2006 | Hoang et al. |
| 7,151,009 | B2 | 12/2006 | Kim et al. |
| 7,157,787 | B2 | 1/2007 | Kim et al. |
| 7,215,033 | B2 | 5/2007 | Lee et al. |
| 7,217,994 | B2 * | 5/2007 | Zhu .......... H01L 23/5385 257/686 |
| 7,276,799 | B2 | 10/2007 | Lee et al. |
| 7,279,795 | B2 | 10/2007 | Periaman et al. |
| 7,307,005 | B2 | 12/2007 | Kobrinsky et al. |
| 7,317,256 | B2 | 1/2008 | Williams et al. |
| 7,320,928 | B2 | 1/2008 | Kloster et al. |
| 7,345,350 | B2 | 3/2008 | Sinha |
| 7,402,442 | B2 | 7/2008 | Condorelli et al. |
| 7,402,515 | B2 | 7/2008 | Arana et al. |
| 7,410,884 | B2 | 8/2008 | Ramanathan et al. |
| 7,432,592 | B2 | 10/2008 | Shi et al. |
| 7,494,845 | B2 | 2/2009 | Hwang et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,576,435 | B2 | 8/2009 | Chao |
| 7,632,719 | B2 | 12/2009 | Choi et al. |
| 7,659,632 | B2 | 2/2010 | Tsao et al. |
| 7,834,450 | B2 | 11/2010 | Kang |
| 7,928,582 | B2 | 4/2011 | Hutto |
| 8,164,171 | B2 | 4/2012 | Lin et al. |
| 8,284,561 | B2 | 10/2012 | Su et al. |
| 8,361,842 | B2 | 1/2013 | Yu et al. |
| 8,519,537 | B2 | 8/2013 | Jeng et al. |
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,796,846 | B2 | 8/2014 | Lin et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,865,521 | B2 | 10/2014 | Jeng et al. |
| 8,877,554 | B2 | 11/2014 | Tsai et al. |
| 8,896,109 | B2 | 11/2014 | Pagaila et al. |
| 8,970,023 | B2 | 3/2015 | Chou et al. |
| 2002/0003232 | A1 | 1/2002 | Ahn et al. |
| 2002/0003297 | A1 | 1/2002 | Smola et al. |
| 2002/0081755 | A1 | 6/2002 | Degani et al. |
| 2003/0035270 | A1 | 2/2003 | Shieh et al. |
| 2004/0056344 | A1 | 3/2004 | Ogawa et al. |
| 2004/0245608 | A1 * | 12/2004 | Huang .......... H01L 21/561 257/676 |
| 2006/0113653 | A1 | 6/2006 | Xiaoqi et al. |
| 2006/0145328 | A1 | 7/2006 | Hsu |
| 2006/0249828 | A1 | 11/2006 | Hong |
| 2007/0289127 | A1 | 12/2007 | Hurwitz et al. |
| 2007/0290319 | A1 | 12/2007 | Kim |
| 2008/0116589 | A1 | 5/2008 | Li et al. |
| 2008/0185719 | A1 | 8/2008 | Cablao et al. |
| 2008/0248610 | A1 | 10/2008 | Chew et al. |
| 2008/0265434 | A1 * | 10/2008 | Kurita .......... H01L 21/563 257/777 |
| 2008/0272477 | A1 | 11/2008 | Do et al. |
| 2008/0283992 | A1 | 11/2008 | Palaniappan et al. |
| 2008/0315372 | A1 | 12/2008 | Kuan et al. |
| 2009/0065927 | A1 | 3/2009 | Meyer |
| 2009/0121326 | A1 | 5/2009 | Kim et al. |
| 2009/0186446 | A1 | 7/2009 | Kwon et al. |
| 2009/0230531 | A1 | 9/2009 | Do et al. |
| 2009/0243065 | A1 | 10/2009 | Sugino et al. |
| 2009/0309212 | A1 | 12/2009 | Shim et al. |
| 2009/0321921 | A1 | 12/2009 | Hwang |
| 2010/0019370 | A1 * | 1/2010 | Pressel .......... B81B 7/02 257/690 |
| 2010/0052135 | A1 | 3/2010 | Shim et al. |
| 2010/0102428 | A1 | 4/2010 | Lee et al. |
| 2010/0244219 | A1 | 9/2010 | Pagaila et al. |
| 2010/0276787 | A1 | 11/2010 | Yu et al. |
| 2010/0314749 | A1 | 12/2010 | Kurita |
| 2011/0024888 | A1 | 2/2011 | Pagaila et al. |
| 2011/0210444 | A1 | 9/2011 | Jeng et al. |
| 2011/0241192 | A1 | 10/2011 | Ding et al. |
| 2011/0278732 | A1 | 11/2011 | Yu et al. |

(56) References Cited

U.S. PATENT DOCUMENTS

| | | |
|---|---|---|
| 2011/0285005 A1 | 11/2011 | Lin et al. |
| 2011/0291288 A1 | 12/2011 | Wu et al. |
| 2011/0304999 A1 | 12/2011 | Yu et al. |
| 2012/0049352 A1 | 3/2012 | Kang et al. |
| 2012/0286407 A1* | 11/2012 | Choi .................. H01L 21/4853 257/670 |
| 2013/0026468 A1 | 1/2013 | Yoshimuta et al. |
| 2013/0062760 A1* | 3/2013 | Hung ................... H01L 21/561 257/738 |
| 2013/0062761 A1 | 3/2013 | Lin et al. |
| 2013/0075903 A1 | 3/2013 | Pagaila et al. |
| 2013/0082364 A1* | 4/2013 | Wang ................ H01L 21/76802 257/659 |
| 2013/0119533 A1 | 5/2013 | Chen et al. |
| 2013/0168848 A1 | 7/2013 | Lin et al. |
| 2013/0214426 A1 | 8/2013 | Zhao et al. |
| 2013/0252378 A1 | 9/2013 | Jeng et al. |
| 2013/0307140 A1 | 11/2013 | Huang et al. |
| 2014/0203429 A1 | 7/2014 | Yu et al. |
| 2014/0217610 A1 | 8/2014 | Jeng et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2014/0353823 A1 | 12/2014 | Park et al. |
| 2015/0235993 A1 | 8/2015 | Cheng et al. |
| 2016/0240508 A1 | 8/2016 | Hou et al. |

FOREIGN PATENT DOCUMENTS

| | | |
|---|---|---|
| KR | 20090028687 A | 3/2009 |
| KR | 20090122277 A | 11/2009 |
| KR | 20100119507 A | 11/2010 |
| KR | 20120019091 A | 3/2012 |
| KR | 20130077031 A | 7/2013 |

OTHER PUBLICATIONS

Kurita et al., "SMAFTI Package Technology Features Wide-Band and Large-Capacity Memory", Innovative Common Technologies to Support State-of-the-Art Products, pp. 52-56.

Motohashi et al., "SMAFTI Package with Planarized Multilayer Interconnects", IEEE, Electronic Components and Technology Conference, 2009, pp. 599-606.

Kurita et al., "SMAFTI Packaging Technology for New Interconnect Hierarchy", IEEE, NEC Electronics Corporation Sagamihara, Kanagawa, 229-1198, Japan, 2009, pp. 220-222.

* cited by examiner

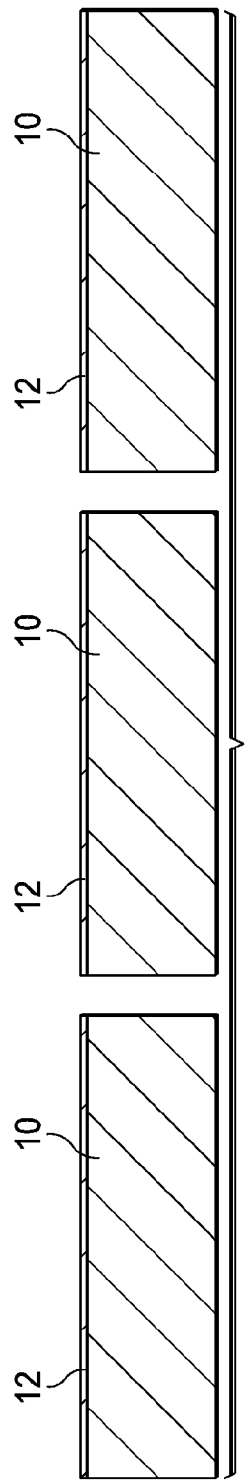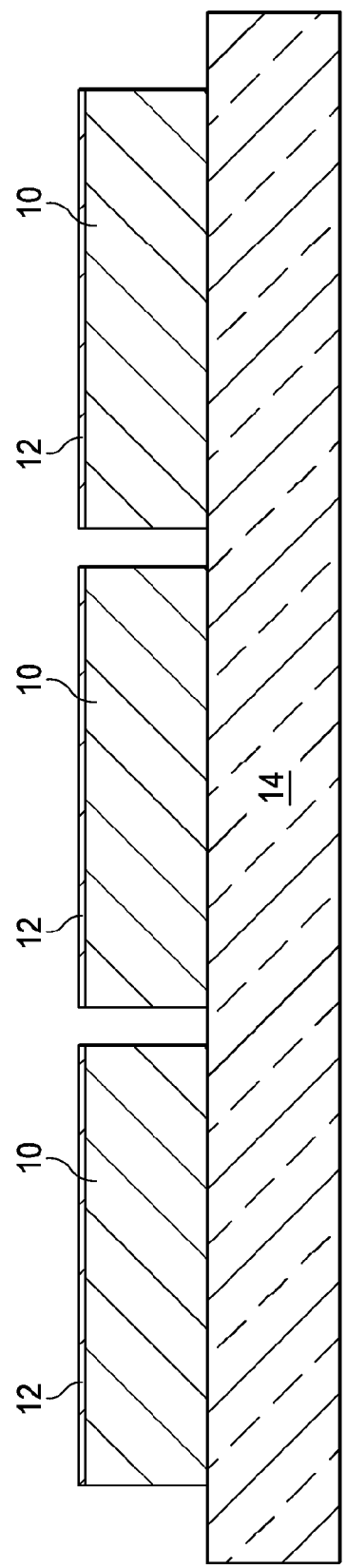

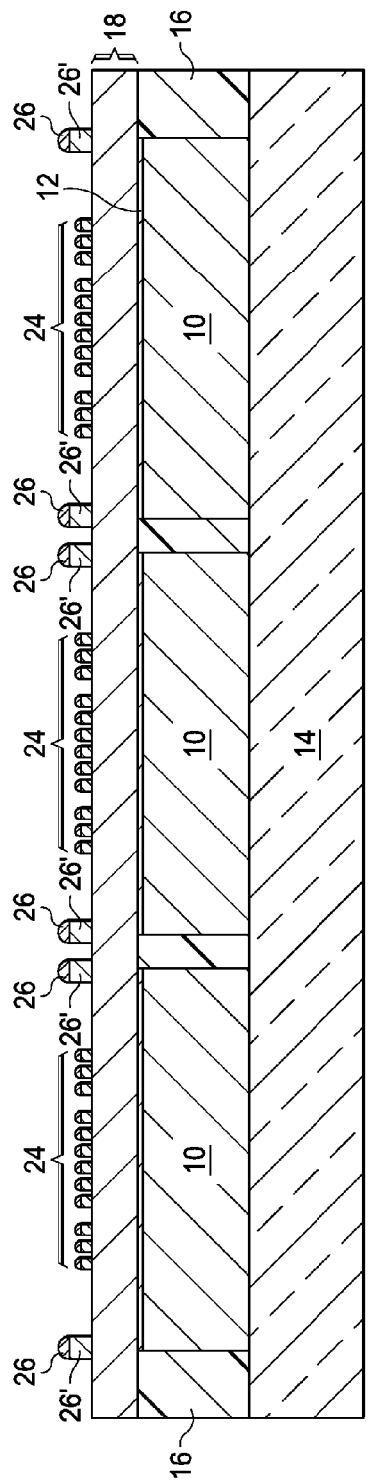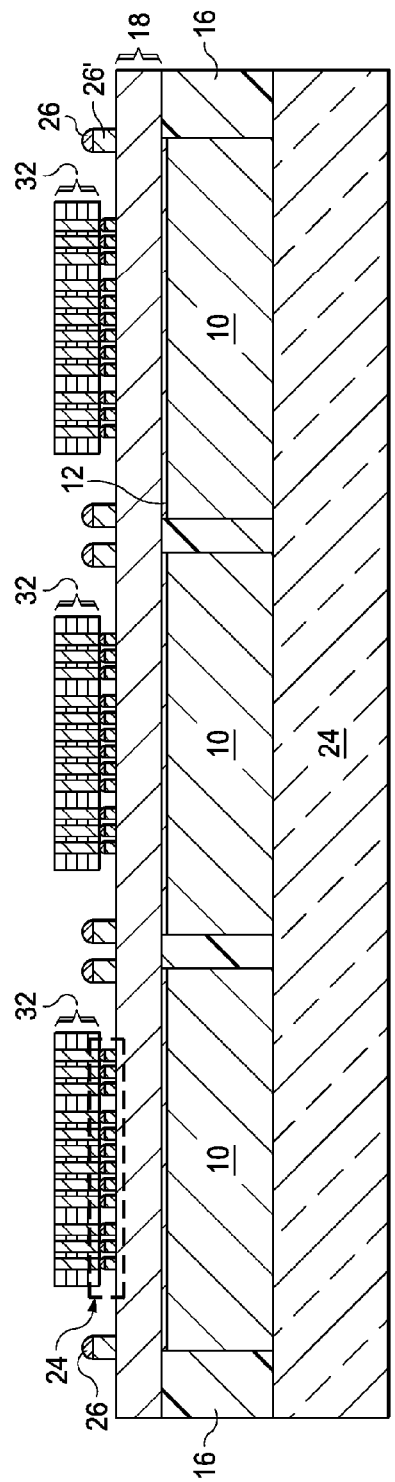
FIG. 1G
FIG. 1H

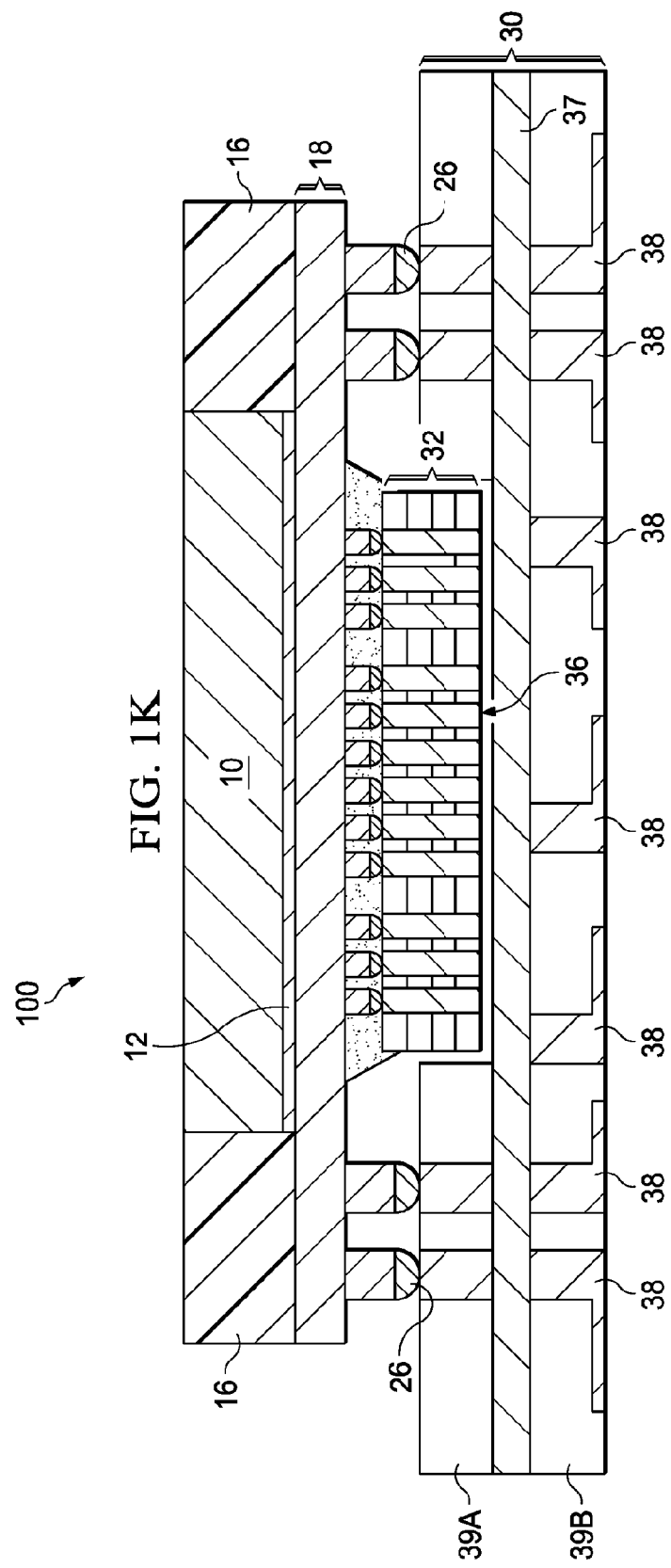

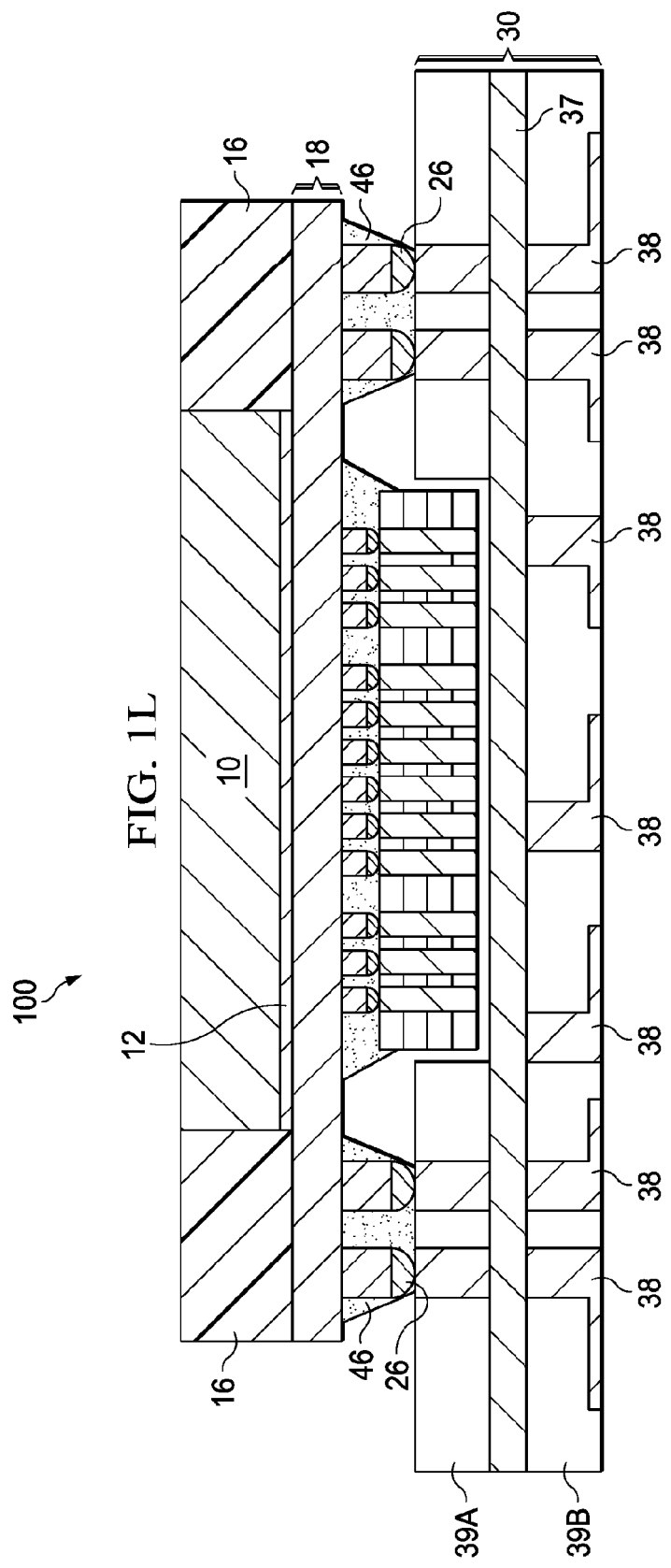

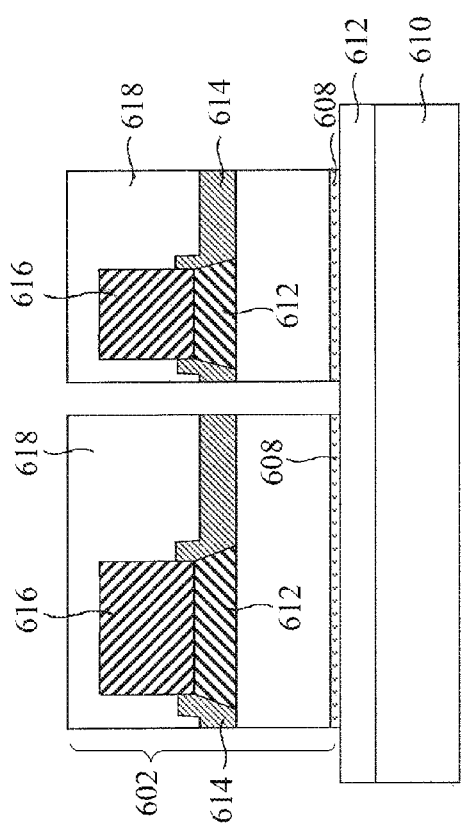
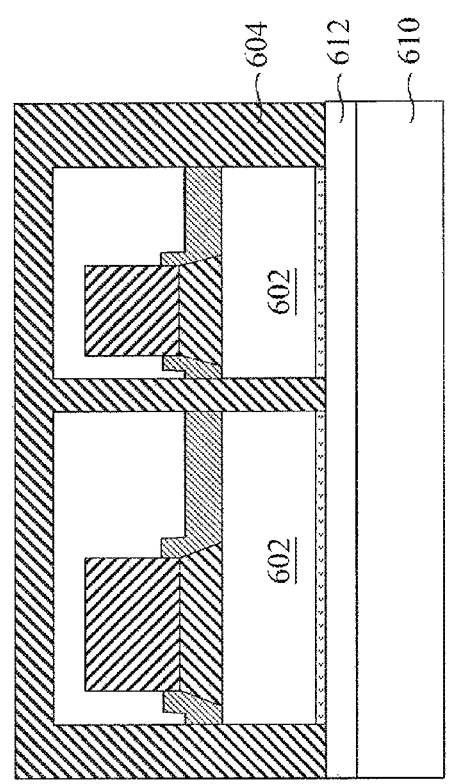
FIG. 7A
FIG. 7B

SUBSTRATE DESIGN FOR SEMICONDUCTOR PACKAGES AND METHOD OF FORMING SAME

PRIORITY CLAIM AND CROSS-REFERENCE

This application is a continuation-in-part of U.S. patent application Ser. No. 14/181,305, filed Feb. 14, 2014, entitled "Substrate Design for Semiconductor Packages and Method of Forming Same," which application is hereby incorporated herein by reference.

BACKGROUND

In an aspect of integrated circuit packaging technologies, individual semiconductor dies may formed and are initially isolated. These semiconductor dies may then be bonded together, and the resulting die stack may be connected to other package components such as package substrates (e.g., interposers, printed circuit boards, and the like) using connectors on a bottom die of the die stack.

The resulting packages are known as Three-Dimensional Integrated Circuits (3DICs). Top dies of a die stack may be electrically connected to the other package components through interconnect structures (e.g., through-substrate vias (TSVs)) in bottom dies of the die stack. However, existing 3DIC packages may include numerous limitations. For example, the bonded die stack and other package components may result in a large form factor and may require complex heat dissipation features. Furthermore, existing interconnect structures (e.g., TSVs) of the bottom die may be costly to manufacture and result in long conduction paths (e.g., signal/power paths) to top dies of the die stack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A through 7F illustrate cross-sectional views of various intermediary stages of manufacturing a semiconductor package in accordance with some alternative embodiments;

DETAILED DESCRIPTION

Figure 1C:
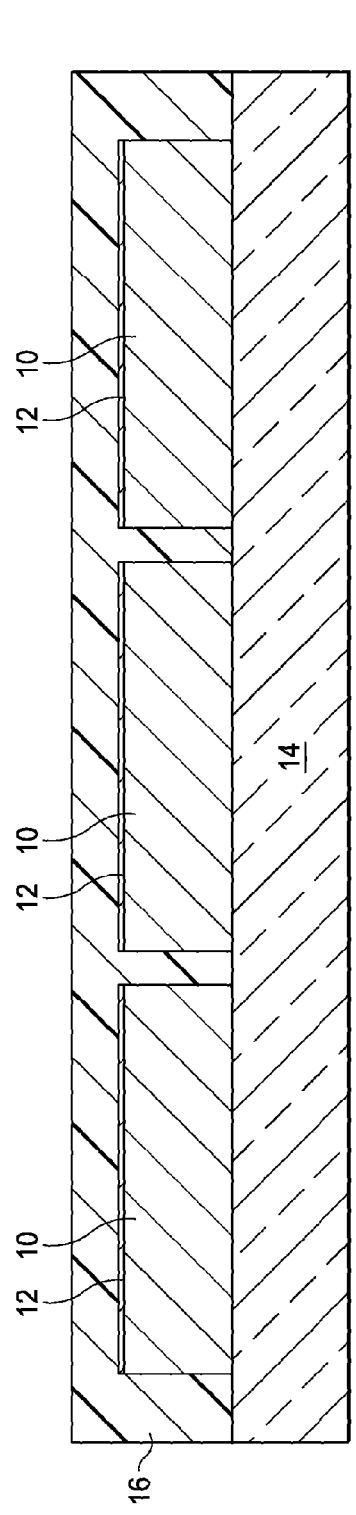
FIGS. 1A through 1N illustrate cross-sectional views of various intermediary stages of manufacturing a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments may include a plurality of first dies (e.g., memory dies) electrically connected to one or more second dies (e.g., logic dies) through first input/output (I/O) pads and redistribution layers (RDLs) formed on the second dies. The resulting die stack may be bonded to another package component such as an interposer, package substrate, printed circuit board, and the like through second I/O pads and the RDLs of the second dies. The package substrate may include a cavity, and the first dies may be disposed in the cavity. Thus, a three-dimensional integrated circuit (3DIC) such as a chip on fan-out package may be made with a relatively small form factor at a relatively low cost and having relatively short conduction paths (e.g., signal/power paths). Furthermore, one or more heat dissipation features may be independently formed on opposite surfaces of the first and/or second dies.

Figure 1D:
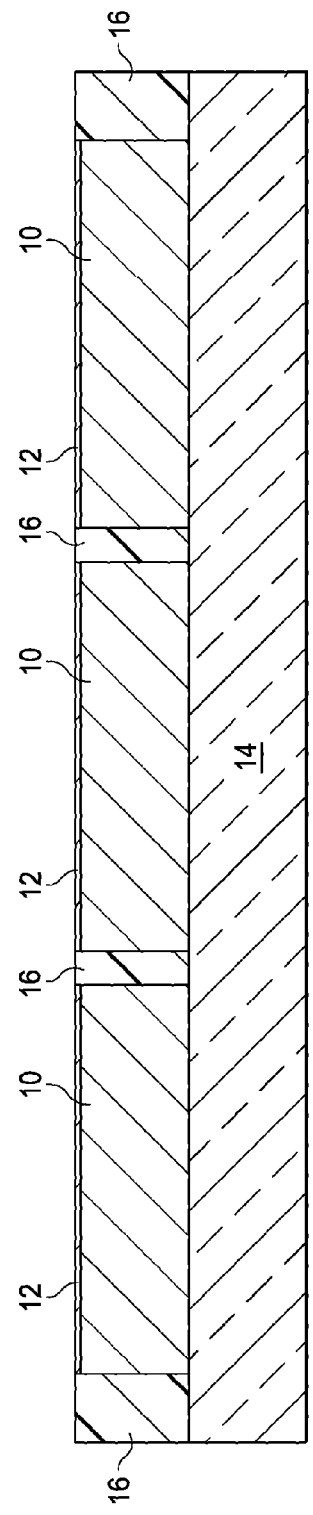
Figure 1E:
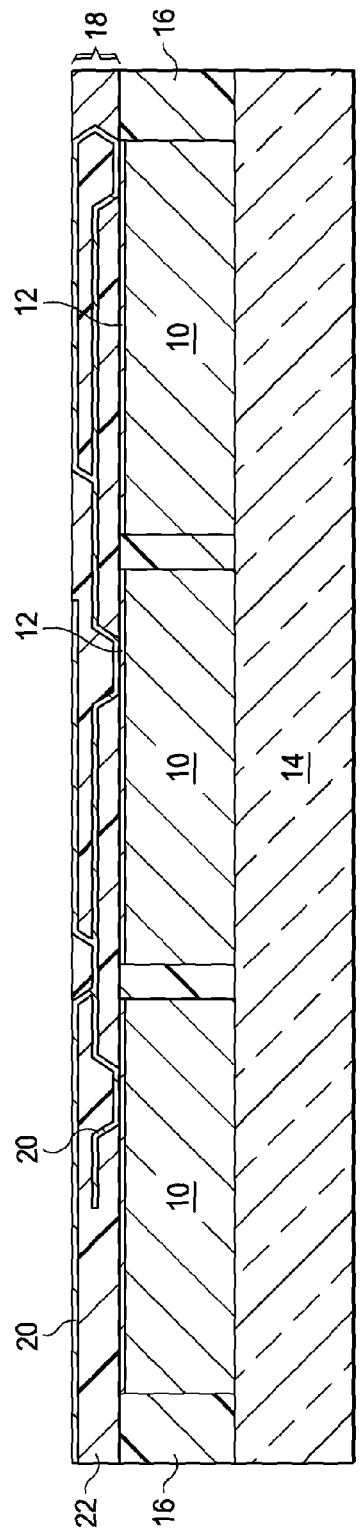
Figure 1F:
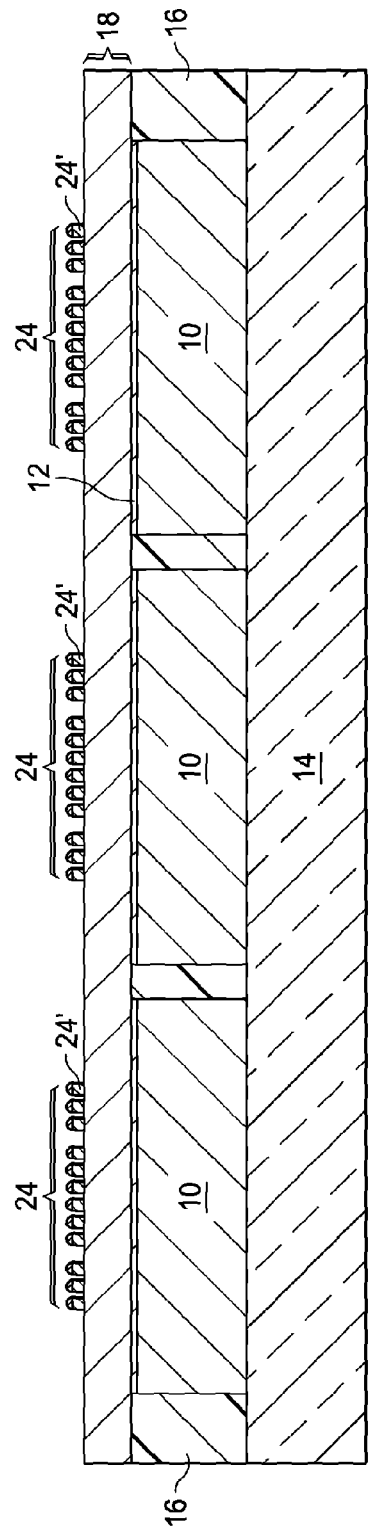
Figure 1I:
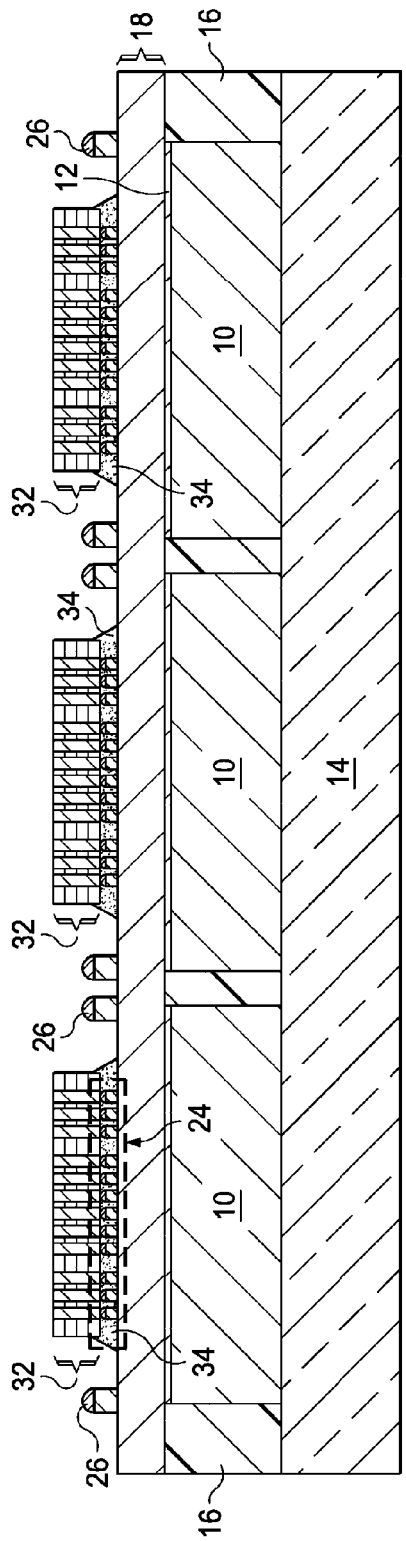
Figure 1J:
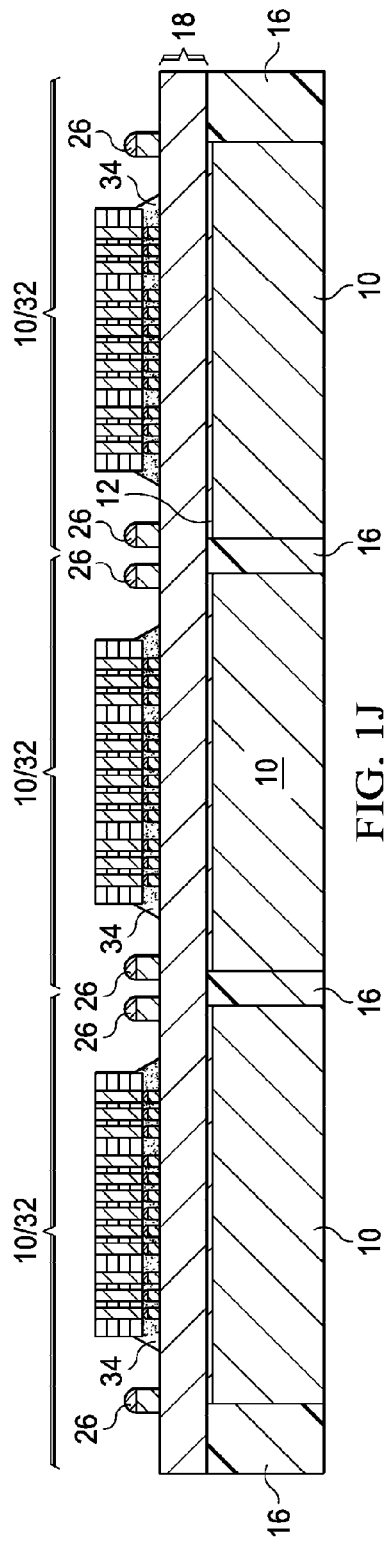
Figure 1M:
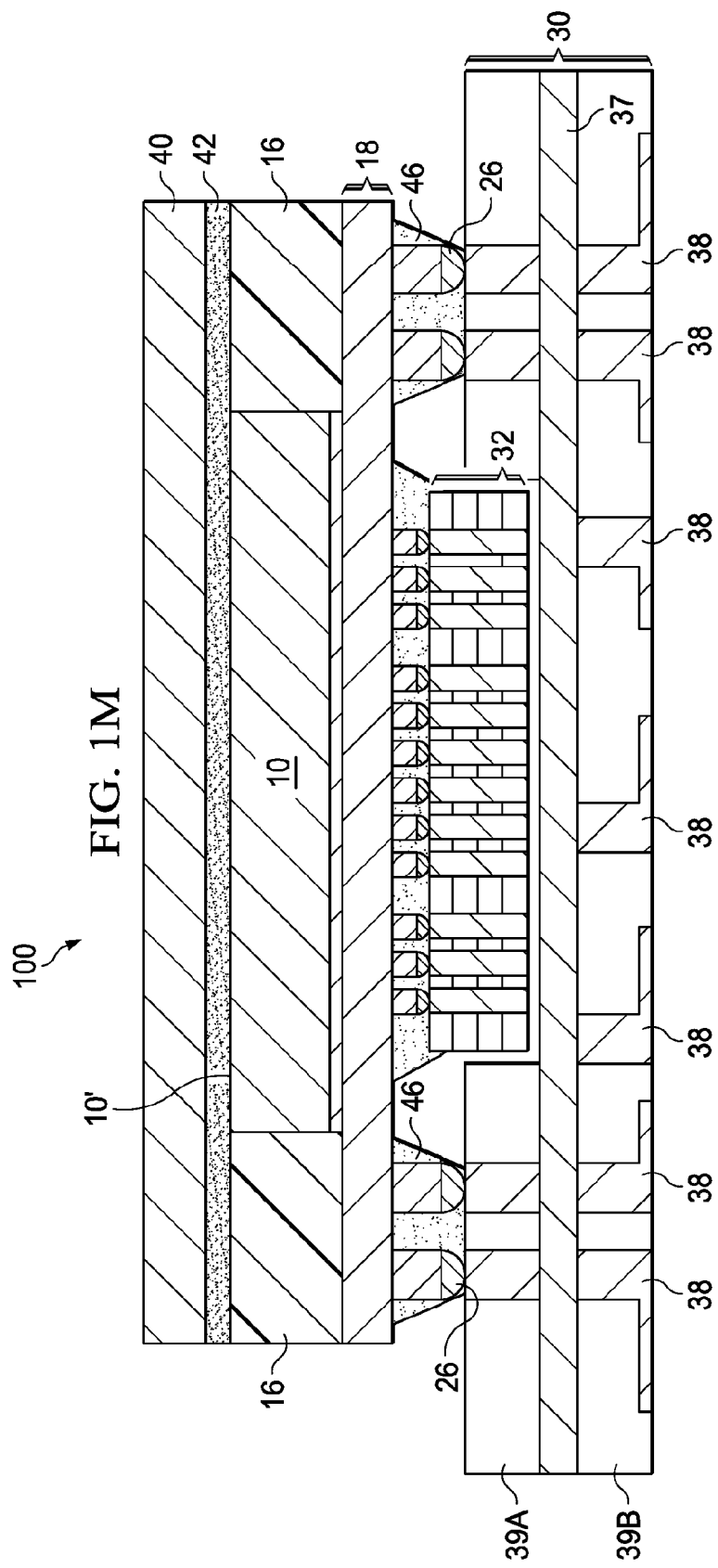
Figure 1N:
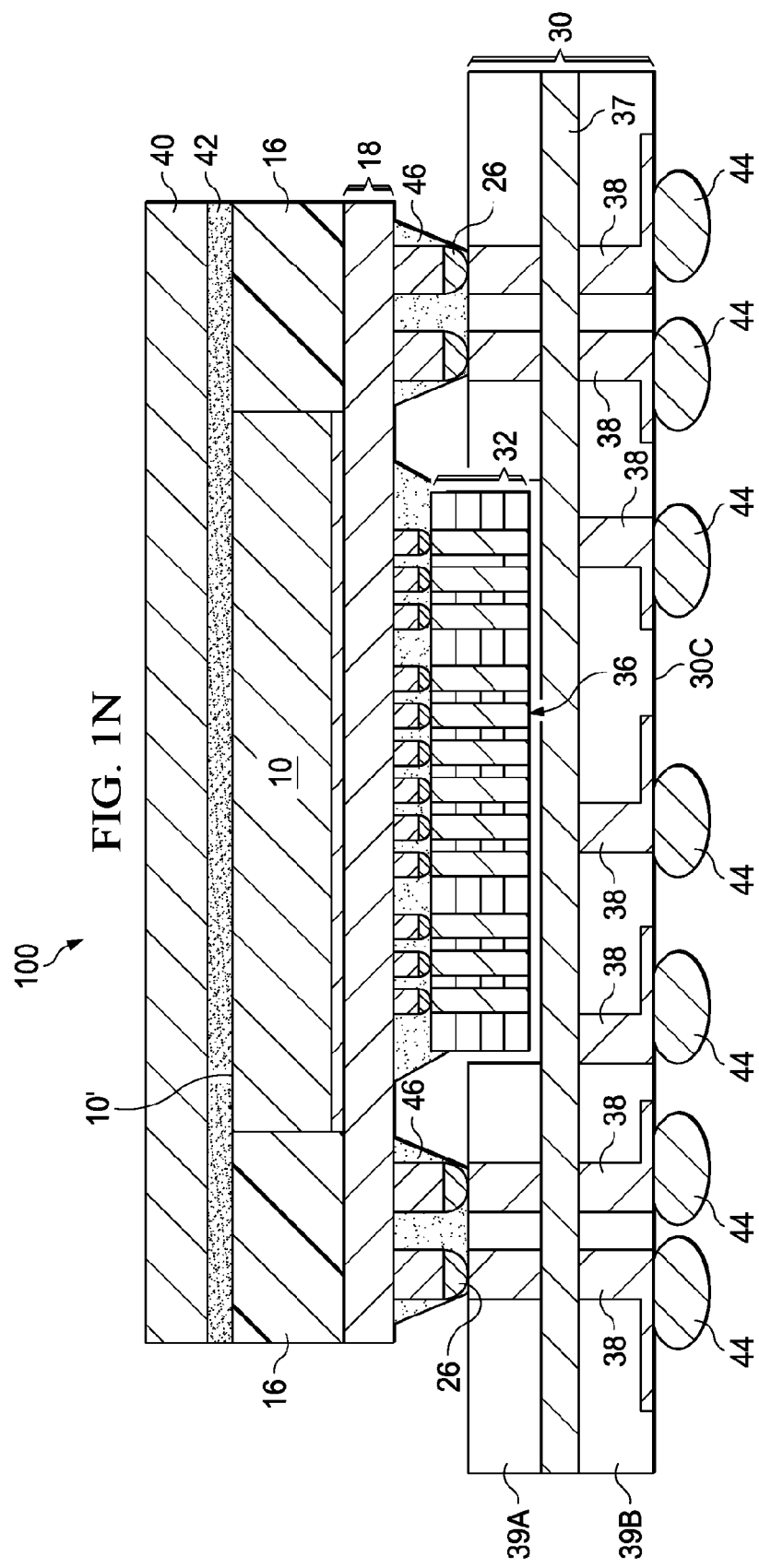

FIGS. 1A through 1N illustrate cross-sectional views of various intermediary stages of manufacturing an integrated circuit (IC) package 100 (see FIG. 1N) in accordance with various embodiments. FIG. 1A illustrates a plurality of dies 10. Dies 10 may include a substrate, active devices, and interconnect layers (not shown). The substrate may be a bulk silicon substrate although other semiconductor materials including group III, group IV, and group V elements may also be used. Alternatively, the substrate may be a silicon-on-insulator (SOI) substrate. Active devices such as transistors may be formed on the top surface of the substrate. Interconnect layers may be formed over the active devices and the substrate.

The interconnect layers may include an inter-layer dielectric (ILD)/inter-metal dielectric layers (IMDs) formed over the substrate. The ILD and IMDs may be formed of low-k dielectric materials having k values, for example, lower than about 4.0 or even about 2.8. In some embodiments, the ILD and IMDs comprise silicon oxide, SiCOH, and the like.

A contact layer 12 including one or more contact pads is formed over the interconnect structure and may be electrically coupled to the active devices through various metallic lines and vias in the interconnect layers. Contact pads in contact layer 12 may be made of a metallic material such as aluminum, although other metallic materials may also be used. A passivation layer (not shown) may be formed over contact layer 12 out of non-organic materials such as silicon oxide, un-doped silicate glass, silicon oxynitride, and the like. The passivation layer may extend over and cover edge portions of contact pads in contact layer 12. Openings may be formed in portions of the passivation layer that cover the contact pads, exposing at least a portion of the contact pads in contact layer 12. The various features of dies 10 may be formed by any suitable method and are not described in further detail herein. Furthermore, dies 10 may be formed in a wafer (not shown) and singulated. Functional testing may be performed on dies 10. Thus, dies 10 in FIG. 1A may include only known good dies, which have passed one or more functional quality tests.

Next, referring to FIG. 1B, dies 10 may be placed on a carrier 14. Carrier 14 may be made of a suitable material, for example, glass or a carrier tape. Dies 10 may be affixed to carrier 14 through one or more adhesive layers (not shown). The adhesive layers may be formed of any temporary adhesive material such as ultraviolet (UV) tape, wax, glue, and the like. In some embodiments, the adhesive layers may further include a die attach film (DAF), which may have optionally been formed under dies 10 prior to their placement on carrier 14.

In FIG. 1C, a molding compound 16 may be used to fill gaps between dies 10 and to cover top surfaces of dies 10. Molding compound 16 may include any suitable material such as an epoxy resin, a molding underfill, and the like. Suitable methods for forming molding compound 16 may include compressive molding, transfer molding, liquid encapsulent molding, and the like. For example, molding compound 16 may be dispensed between dies 10 in liquid form. A curing process may then be performed to solidify molding compound 16.

In FIG. 1D, a planarization process, such as a grinding process (e.g., a chemical-mechanical polish (CMP) or mechanical grinding) or etch back, may be performed on molding compound 16 to expose contact layer 12 (and any contact pads therein) on dies 10. In a top down view of dies 10 (not shown), molding compound 16 may encircle dies 10.

FIG. 1E illustrates the formation of redistribution layers (RDLs) 18 over dies 10 and molding compound 16. As illustrated by FIG. 1E, RDLs 18 may extend laterally past edges of dies 10 over molding compound 16. RDLs 18 may include interconnect structures 20 formed in one or more polymer layers 22. Polymer layers 22 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, and the like.

Interconnect structures 20 (e.g., conductive lines and/or vias) may be formed in polymer layers 22 and electrically connected to contact layer 12 of dies 10. The formation of interconnect structures 20 may include patterning polymer layers 22 (e.g., using a combination of photolithography and etching processes) and forming interconnect structures 20 (e.g., depositing a seed layer and using a mask layer to define the shape of interconnect structures 20) in the patterned polymer layers 22. Interconnect structures 20 may be formed of copper or a copper alloy although other metals such as aluminum, gold, and the like may also be used. Interconnect structures 20 may be electrically connected to contact pads in contact layer 12 (and as a result, active devices) in dies 10.

FIGS. 1F and 1G illustrate the formation of connectors 24 and 26 over RDLs 18. Notably, connectors 24 and 26 are formed on a same side of dies 10 (i.e., on a same surface of RDLs 18). Connectors 24 and 26 may be formed of any suitable material (e.g., copper, solder, and the like) using any suitable method. In some embodiments, the formation of connectors 24 and 26 may first include the formation of under bump metallurgies (UBMs) 24'/26' electrically connected to active devices in dies 10 through RDLs 18. Connectors 24 and 26 may extend laterally past edges of dies 10, forming fan-out interconnect structures. Thus, the inclusion of RDLs 18 may increase the number of connectors 24 and 26 (e.g., input/output pads) connected to dies 10. The increased number of connectors 24 and 26 may allow for increased bandwidth, increased processing speed (e.g., due to shorter signaling paths), lower power consumption (e.g., due to shorter power conduction paths), and the like in subsequently formed IC packages (e.g., package 100 of FIG. 1N).

Furthermore, connectors 24 and 26 may vary in size. For example, connectors 24 may be microbumps having a pitch of about 40 µm or more while connectors 26 may be controlled collapse chip connection (C4) bumps having a pitch of about 140 µm to about 150 µm. In alternative embodiments, connectors 24 and 26 may include different dimensions. Thus, as illustrated by FIGS. 1F and 1G, connectors 24 may be formed prior to connectors 26 to allow for the size differences.

The differing sizes of connectors 24 and 26 may allow different electrical devices (e.g., having differently sized connectors) to be bonded to dies 10. For example, connectors 24 may be used to electrically connect dies 10 to one or more other device dies 28 (see FIG. 1H), and connectors 26 may be used to electrically connect dies 10 to a package substrate 30 (e.g., a printed circuit board, interposer, and the like, see FIG. 1K). Furthermore, because connectors 24 and 26 are formed on a same side of dies 10, the different electrical devices may also be bonded to a same side of dies 10. Although a particular configuration of dies 10 and RDLs 18 is illustrated, alternative configurations may be applied (e.g., having a different number of RDLs 18 and/or connectors 24/26) in alternative embodiments.

In FIG. 1H, a plurality of dies 32 may be bonded to dies 10 through connectors 24 (e.g., by reflowing connectors 24) to form die stacks 10/32. In some embodiments, dies 32 may be a hybrid memory cube (HMC) comprising multiple stacked memory dies, for example. Other configurations of dies, including die stacks, may also be used. Dies 32 may be electrically connected to active devices in dies 10 through RDLs 18. In some embodiments, die stack 10/32 may include memory dies 32 (e.g., dynamic random access memory (DRAM) dies) bonded to dies 10, which may be logic dies providing control functionality for memory dies 32. In alternative embodiments, other types of dies may be included in dies stacks 10/32. Next, as illustrated in FIG. 1I, underfill 34 may be dispensed between dies 32 and RDLs 18 around connectors 24. Underfill 34 may provide support for connectors 24.

FIG. 1J illustrates the removal of carrier 14 from die stack 10/32 using any suitable method. For example, in an embodiment in which the adhesive between dies 10 and carrier 14 is formed of UV tape, dies 10 may be removed by exposing the adhesive layer to UV light. Subsequently, die stacks 10/34 may be singulated for packaging in an IC package. The singulation of die stacks 10/34 may include the use of a suitable pick-and-place tool.

Next, as illustrated by FIG. 1K, each die stack 10/32 may be bonded to a package substrate 30 through connectors 26. A reflow may be performed on connectors 26 to bond die stack 10/32 to package substrate 30. Subsequently, as illustrated by FIG. 1L, an underfill 46 maybe dispensed between die stack 10/32 and package substrate 30 around connectors 26. Underfill 46 may be substantially similar to underfill 34.

Package substrate 30 may be an interposer, a printed circuit board (PCB), and the like. For example, package substrate 30 may include a core 37 and one or more build-up layers 39 (labeled 39A and 39B) disposed on either side of core 37. Interconnect structures 38 (e.g., conductive lines, vias, and/or through vias) may be included in package substrate 30 to provide functional electrical purposes such as power, ground, and/or signal layers. Other configurations of package substrate 30 may also be used.

Furthermore, package substrate 30 may include a cavity 36. Cavity 36 may not extend through package substrate 30. Rather, a portion or all of build-up layers 39A (e.g., build-up layers 39 disposed on a same side of core 37 as the die stack 10/32) may be patterned to form cavity 36. As illustrated in FIG. 1L, cavity 36 may not affect the configuration of core 37 and/or build-up layers 39B (e.g., build-up layers 39 disposed on an opposite side of core 37 as die stack 10/32). The configuration of package substrate 30 may be designed so that active interconnect structures 38 (e.g., power, ground, and/or signal layers in build-up layers 39A) may be routed to avoid cavity 36. Thus, cavity 36 may not substantially interfere with the functionality of package substrate 30.

Figure 4B:
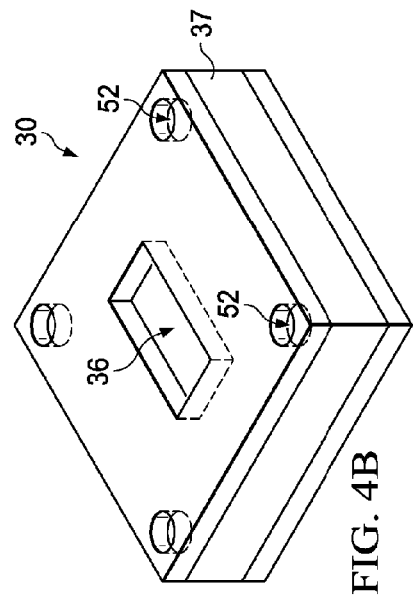
FIGS. 4A through 4L illustrate prospective views of various intermediary stages of manufacturing a package substrate in accordance with some embodiments.
Figure 4D:
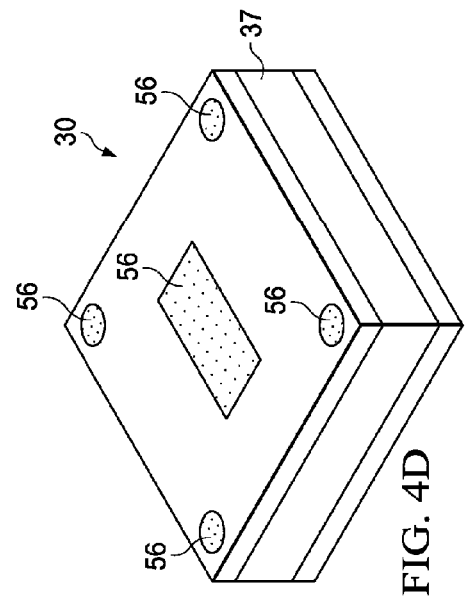
Figure 4A:
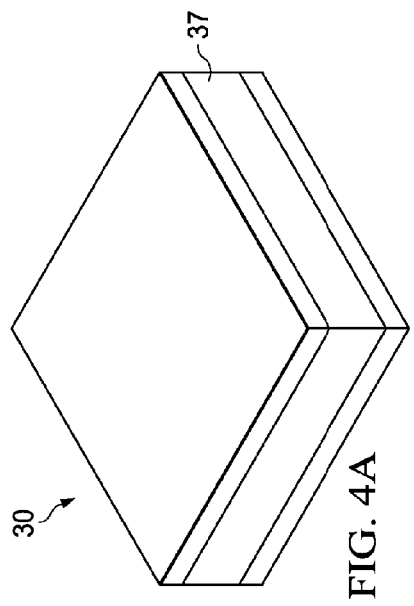

Package substrate 30 may be formed using any suitable method. For example, FIGS. 4A through 4L illustrate prospective views of various intermediary stages of manufacturing a package substrate 30 in accordance with various embodiments. In FIG. 4A, core 37 is provided. Core 36 may be a metal-clad insulated base material such as a copper-clad epoxy-impregnated glass-cloth laminate, a copper-clad polyimide-impregnated glass-cloth laminate, or the like. As illustrated by FIG. 4B, cavity 36 and/or through holes 52 may be formed in core 37, for example, using a mechanical drilling or milling process. The mechanical drilling/milling process may extend through holes 52 through core 37. However, the mechanical drilling/milling process may not extend cavity 36 through core 37.

Figure 4C:
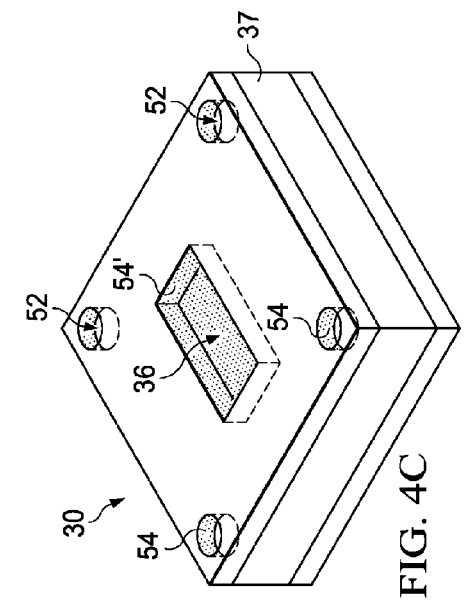

Next, in FIG. 4C, surfaces of through hole 52 and cavity 36 may be plated with metallic material 54, for example, using an electrochemical plating process. In some embodiments, metallic material 54 may comprise copper. The plating of through holes 52 may form through vias for providing electrical connections from one side of core 37 to another. Furthermore, metallic material 54' on surfaces of cavity 36 may act as a laser stop layer in subsequent process steps (see FIG. 4K). In FIG. 4D, cavity 36 and through holes 52 may be filled with a suitable material 56 (e.g, an ink). Material 56 may fill cavity 36/through holes 52 to provide a substantially level surface for forming one or more build-up layers over core 37. A grinding or other planarization technique may be performed on core 37.

Figure 4E:
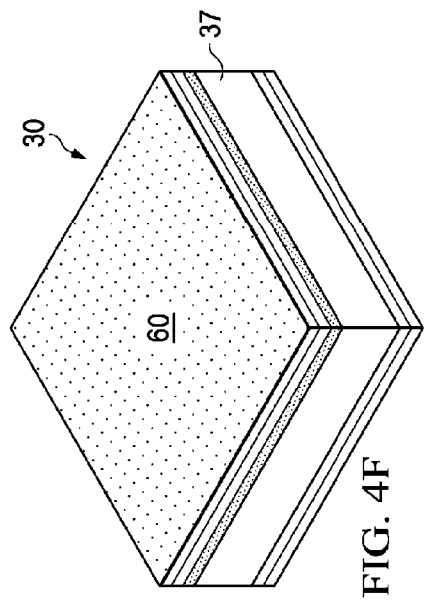
Figure 4F:
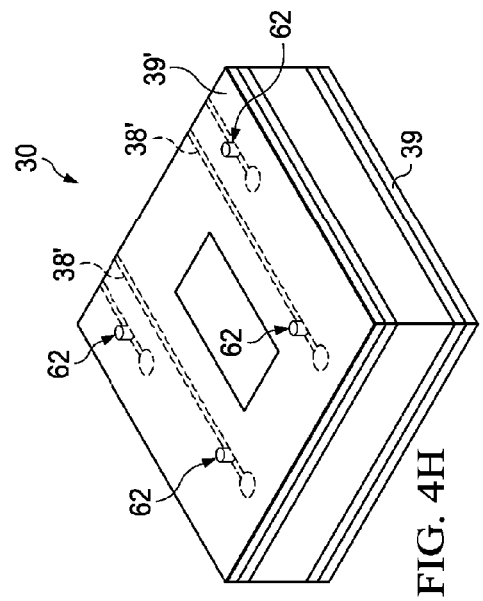
Figure 4G:
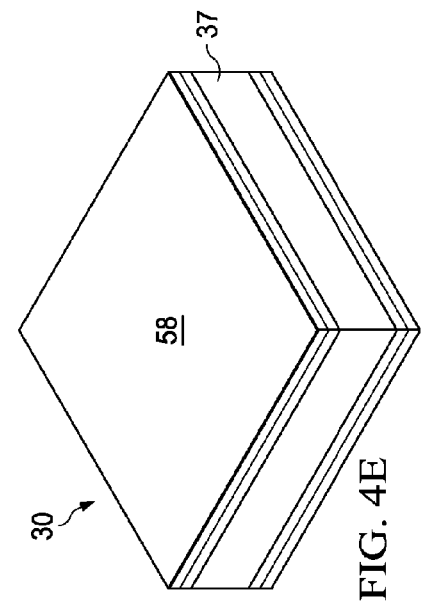

As illustrated by FIGS. 4E through 4I, one or more build-up layers 39 having interconnect structures 38 may be formed on either side of core 37. The formation of build-up layers 39 may include plating core 37 with a conductive layer 58, for example, comprising copper as illustrated by FIG. 4E. Next, as illustrated by FIGS. 4F and 4G, conductive layer 58 may be patterned to form conductive lines 38'. The patterning of conductive layer 58 may include laminating a dry film 60 (e.g., a photoresist) over conductive layer 58, patterning dry film 60 (e.g., using suitable exposure techniques), and etching conductive layer 58 using the patterned dry film 60 as a mask. Subsequently, dry film 60 may be removed.

Figure 4H:
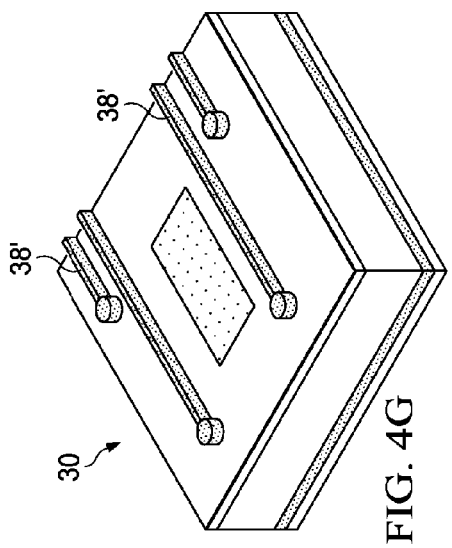
Figure 4I:
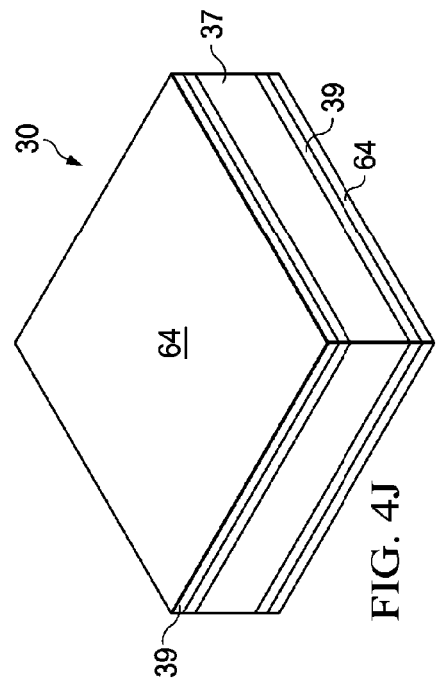

In FIG. 4H, a build-up layer 39' may be laminated over conductive lines 38' (shown in ghost). The lamination of build-up layer 39' may include a curing process (e.g., a heat treatment or pressing process). Openings 62 may be patterned in build-up layer 39' (e.g., through laser drilling), and openings 62 may be aligned with conductive lines 38'. As illustrated by FIG. 4I, additional conductive lines 38'' may be formed over build-up layer 39' using a substantially similar process as illustrated by FIGS. 4E through 4H for forming conductive lines 38' (e.g., conductive layer plating and patterning). The conductive layer plating process used for forming conductive lines 38'' may also plate openings 62 (not illustrated in FIG. 4H), thus forming conductive vias (not illustrated) for interconnecting conductive lines 38' and 38'' through build-up layer 39'. Conductive lines 38'' may be patterned to align with conductive vias formed in openings 62. The process steps illustrated by FIGS. 4E through 4I may be repeated as desired to form any number of build-up layers (e.g., power, ground, and/or signal layers) in package substrate 30. Furthermore, although FIGS. 4E through 4I only illustrate the formation of interconnect structures 38/build-up layers 39 on one side of core 37, similar processes may be applied to form of interconnect structures 38/build-up layers 39 on an opposing side of core 37.

Figure 4J:
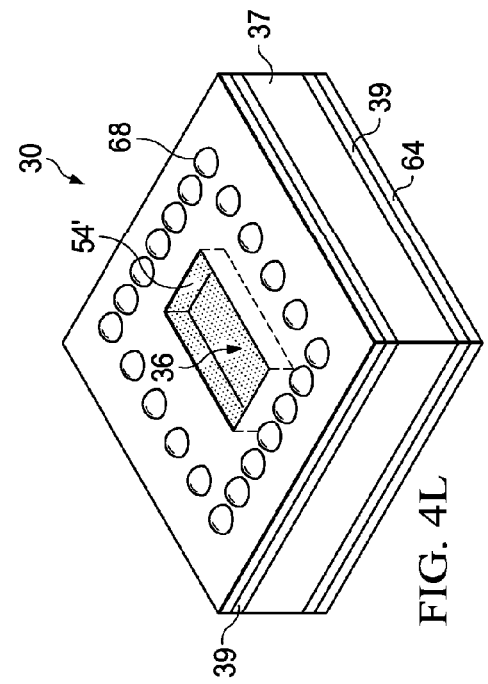
Figure 4K:
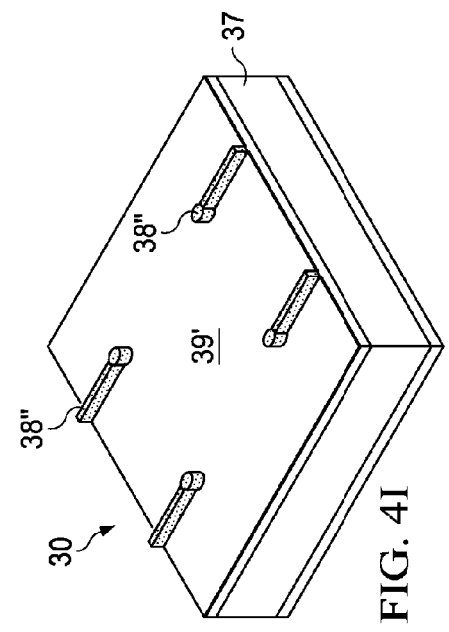
Figure 4L:
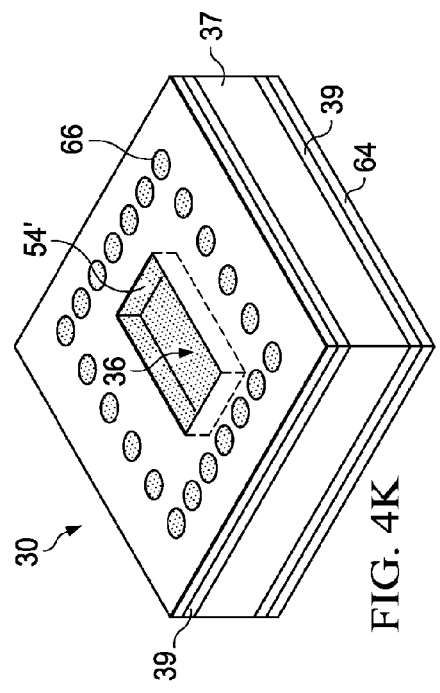

FIG. 4J a solder resist 64 may be formed over build-up layers 39 (e.g., on both sides of core 37). Next, as illustrated by FIG. 4K, cavity 36 may be patterned in package substrate 30. The formation of cavity 36 may include patterning solder resist 63 (e.g., using an exposure technique) and a laser etching build-up layers 39 using material 54' as a laser stop layer. Thus, cavity 36 may not extend through package substrate 30. Furthermore, the patterning of solder resist 64 may pattern openings (not shown) around cavity 36 to expose interconnect structures 38 in build-up layers 39. These openings may be plated with a suitable material (e.g., nickel, aluminum, or the like) to form contact pads 66 on package substrate 30. Contact pads 66 may be electrically connected to interconnect structures 38 in build-up layers 39. Subsequently, as illustrated by FIG. 4L, connectors 68 (e.g., solder balls) may be formed on contact pads 66 for bonding with die stack 10/32.

Referring back to FIG. 1L, when die stack 10/34 is bonded to package substrate 30, dies 32 may be disposed, at least partially, in cavity 36. In a top down view of package 100 (not shown), cavity 36 may encircle dies 32. Thus, the bonded structure may advantageously have a relatively small form factor and higher bandwidth. Furthermore, dies 32 may be electrically connected to package substrate 30 through RDLs 18 and connectors 24/26. In some embodiments, dies 10 may include fewer or be substantially free of through-substrate vias (TSVs) for electrically connecting dies 32 to package substrate 30. The reduced number of TSVs may lower the cost of manufacturing dies 10.

Next, referring to FIG. 1M, a heat dissipation feature 40 is disposed over die 10. Heat dissipation feature 40 may be disposed on a surface of die 10 opposite RDLs 18, connectors 24, and dies 32. Heat dissipation feature 40 may be a contour lid having a high thermal conductivity, for example, between about 200 watts per meter kelvin (W/m·K) to about 400 W/m·K or more, and may be formed using a metal, a metal alloy, and the like. For example, heat dissipation feature 40 may comprise metals and/or metal alloys such as Al, Cu, Ni, Co, combinations thereof, and the like. Heat dissipation feature 40 may also be formed of a composite material, for example silicon carbide, aluminum nitride, graphite, and the like. In some embodiments, heat dissipation feature 40 may also extend over surfaces of molding compound 16.

Compared to conventional 3DICs, where package substrate 30 and dies 32 would be disposed on opposing sides of die 10, package 100 provides die 10 with a surface 10', which may not be used to electrically connect to dies 32 or package substrate 30. Thus, heat dissipation feature 40 may be directly disposed on surface 10' of die 10 for improved heat dissipation.

Interfacing material 42 may be disposed between heat dissipation features 40 and die 10/molding compound 16. Interfacing material 42 may include a thermal interface material (TIM), for example, a polymer having a good thermal conductivity, which may be between about 3 watts per meter kelvin (W/m·K) to about 5 W/m·K or more. Because the TIM may have good thermal conductivity, the TIM may be disposed directly between (e.g., contacting) die 10 and heat dissipation feature 40. Furthermore, interfacing material 42 may also include an adhesive (e.g., an epoxy, silicon resin, and the like) for affixing heat dissipation lid 40 to die 10/molding compound 16. The adhesive used may have a better adhering ability and a lower thermal conductivity than a TIM. For example, the adhesive used may have a thermal conductivity lower than about 0.5 W/m·K. As such, the adhesive portions of interfacing material 42 may be disposed over areas having lower thermal dissipation needs (e.g., over surfaces of molding compound 16).

After the attachment of heat dissipation feature 40, a marking process (e.g., laser marking) may be performed to mark package 100. Furthermore, as illustrated by FIG. 1N, connectors 44 (e.g., ball grid array (BGA) balls) disposed on a surface of package substrate 30 opposite connectors 26 and die stack 10/32. Connectors 44 may be used to electrically connect package 100 to a motherboard (not shown) or another device component of an electrical system.

FIG. 1N illustrates a completed package 100. Because dies 32 is disposed in a cavity 36 of package substrate 30, package 100 may have a relatively small form factor and higher bandwidth. The inclusion of RDL 18 may allow for a greater number of I/O pads for die stack 10/32, which allows various performance advantages such as increased speed, lower power consumption, and the like. Furthermore, package substrate 30 and dies 32 may be disposed on a same side of die 10, allowing heat dissipation feature 40 to be directly disposed on a surface of die 10 for improved heat dissipation.

Figure 2:
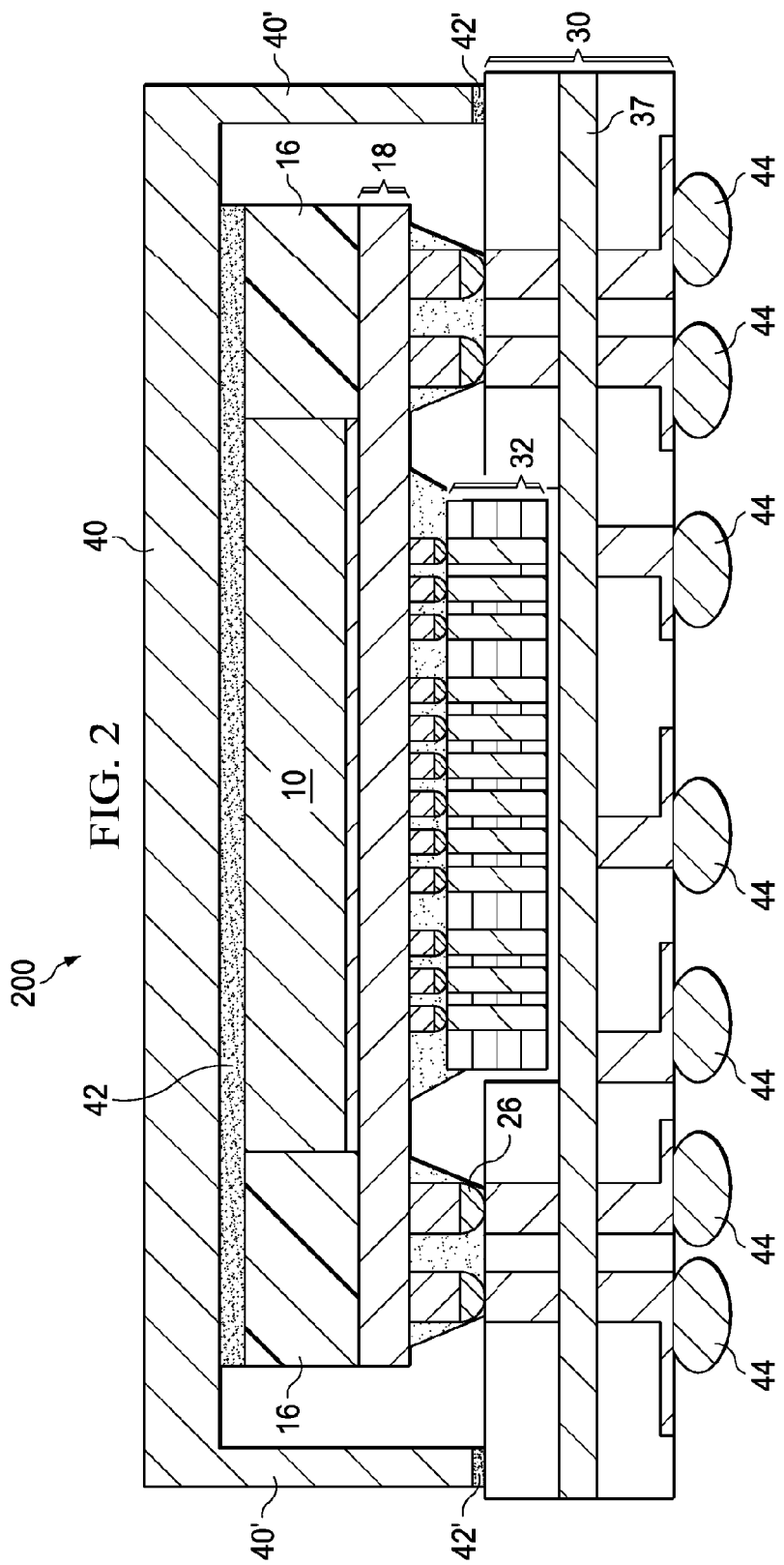
FIG. 2 illustrates a cross-sectional view a semiconductor package in accordance with some alternative embodiments.

FIG. 2 illustrates a cross-sectional view of a package 200 in accordance with various alternative embodiments. Package 200 may be substantially similar to the package 100 where like reference numerals represent like elements. However, heat dissipation feature 40 may include a contour ring portion 40', which may extend past die 10 and RDLs 18 to a top surface of package substrate 30. In a top down view of package 200 (not shown), contour ring portion 40' may encircle die 10. Contour ring portion 40' may be formed of substantially similar materials as the remainder of heat dissipation lid 40 (e.g., a high Tk material) and provide additional heat dissipation for package 200. Contour ring portion 40' may be attached to package substrate 30 using any suitable method such as an adhesive layer 42' disposed between contour ring portion 40' and package substrate 30.

Figure 3A:
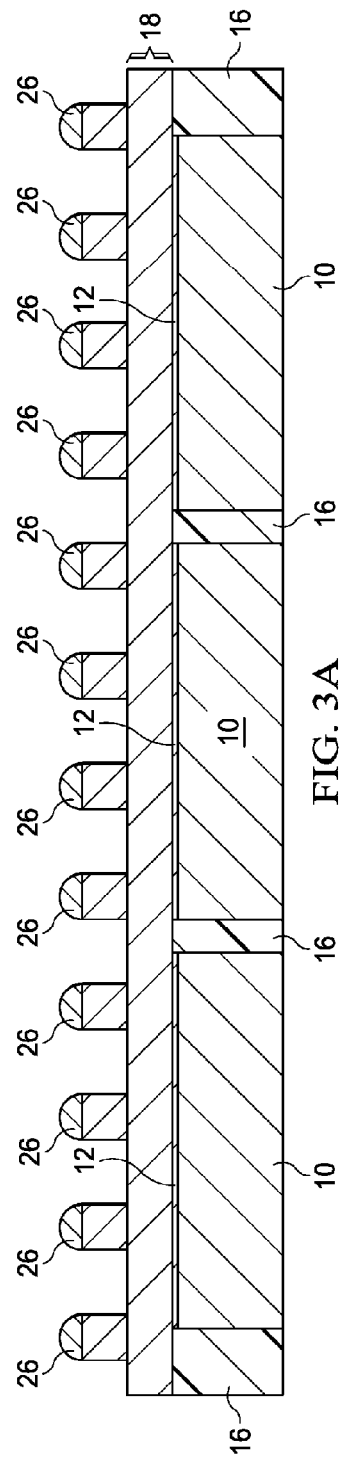
FIGS. 3A through 3E illustrate cross-sectional views of various intermediary stages of manufacturing a semiconductor package in accordance with some alternative embodiments.

FIGS. 3A through 3E illustrates various intermediary steps of manufacturing package 300 in accordance with alternative embodiments. FIG. 3A illustrates a plurality of dies 10 having an RDL 18 and connectors 26 formed over dies 10. The various features illustrated in FIG. 2A may be formed using substantially the same steps and be substantially similar to the features formed in FIGS. 1A through 1J where like reference numerals represent like elements. Thus, detailed description of the features and their formation is omitted for brevity. However, as illustrated by FIG. 2A, dies 10 (including RDLs 18 and connectors 24) may be detached from a carrier (e.g., carrier 14) without the bonding on dies 32. Furthermore, connectors 24 may not be formed over RDLs 18. Instead, the structure illustrated in FIG. 2A includes connectors 26 on RDLs 18 may be of substantially the same size. For example, connectors 26 may be C4 bumps.

Figure 3B:
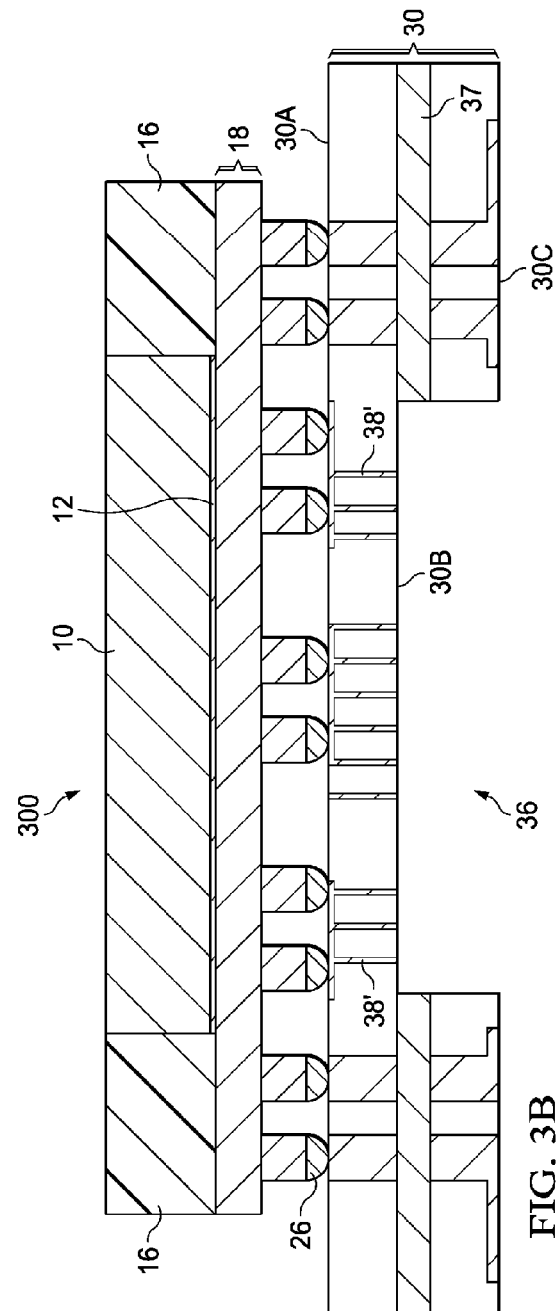

FIG. 3B illustrates the singulation of dies 10 (e.g., along scribe lines using a suitable pick and place tool) and the attachment of dies 10 to package substrate 30 through connectors 26. Notably, die 10 may be bonded to package substrate 30 prior to the attachment of dies 32 to package 300.

The configuration of package substrate 30 in package 300 may be altered from the configuration in package 100. For example, cavity 36 may be disposed on an opposing side (rather than a same side) of package substrate 30. In package 300, die 10 may be bonded to a surface 30A of package substrate 30. Surface 30A may be substantially level. Package substrate 30 may further include surface 30B (e.g., in cavity 36) and surface 30C opposing die 10. Due to the inclusion of cavity 36, surfaces 30B and 30C may not be substantially level. For example, in the orientation illustrated by FIG. 3B, surface 30B may be higher than surface 30C.

The formation of package substrate 30 having cavity 36 may include the patterning of core 37, build-up layer 39B (e.g., disposed on an opposing side of core 37 as die 10), and/or build-up layer 39A (e.g., disposed on a same side of core 37 as die 10). In various embodiments, cavity 36 may not extend through package substrate 30.

Figure 3C:
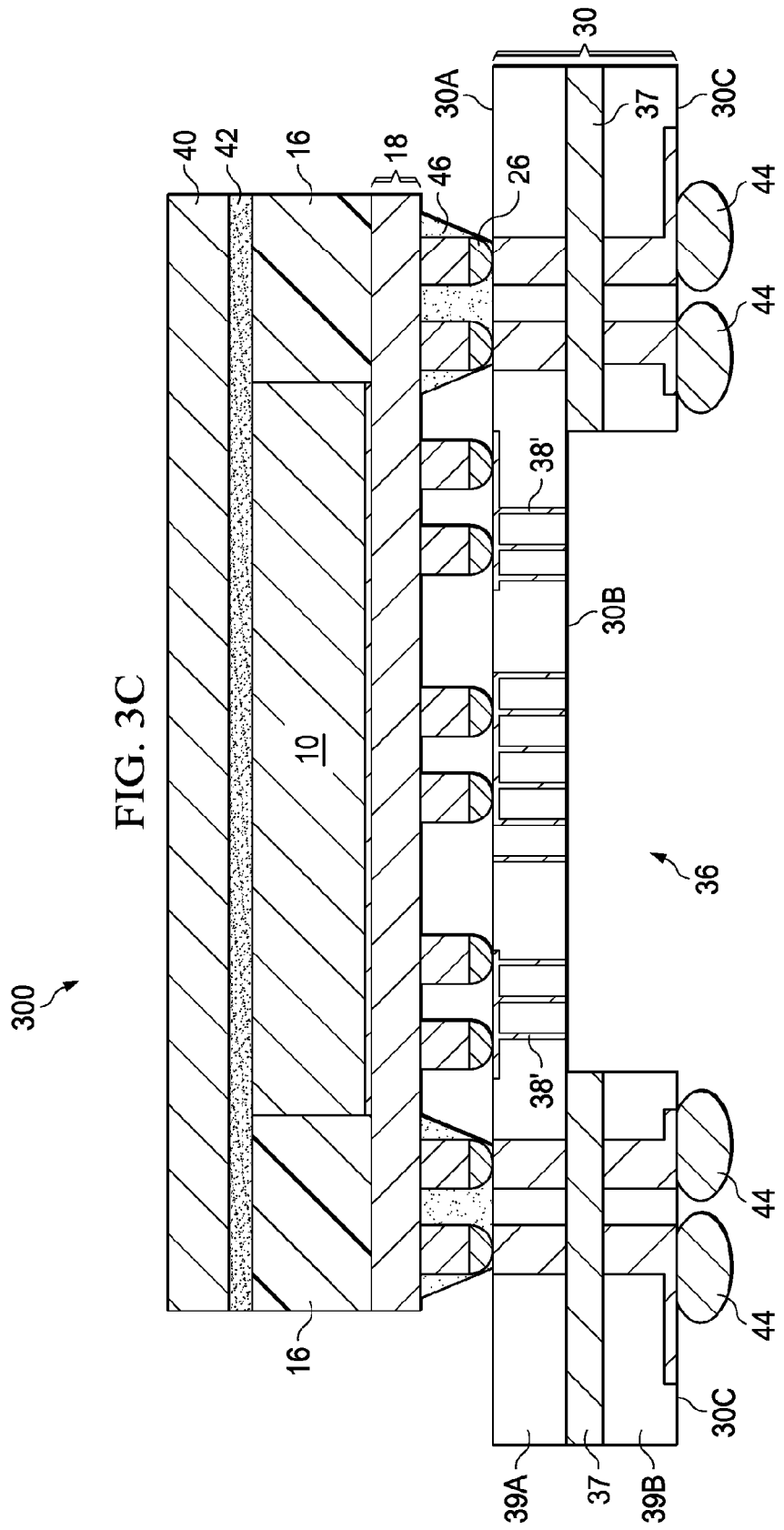

FIG. 3C illustrates the formation of various other features of package 300. For example, a reflow may be performed on connectors 26 and underfill 46 may be dispensed around connectors 26. Connectors 44 may be attached to surface 30C of package substrate 30 opposite die 10. Furthermore, a heat dissipation feature 40 may be disposed over die 10/molding compound 16. An interfacing material 42 (e.g., including a TIM and/or adhesive material) may be disposed between heat dissipation feature 40 and die 10/molding compound 16.

Figure 3D:
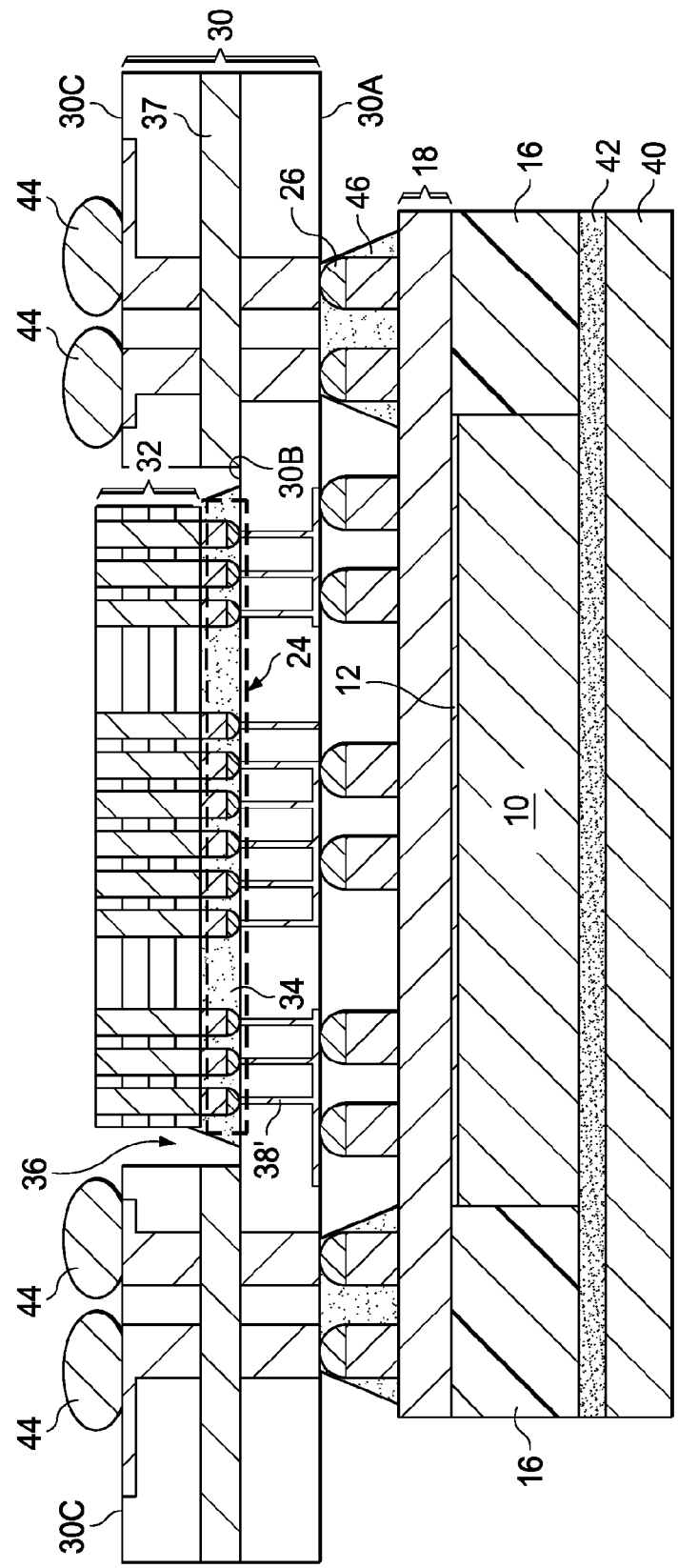
Figure 3E:
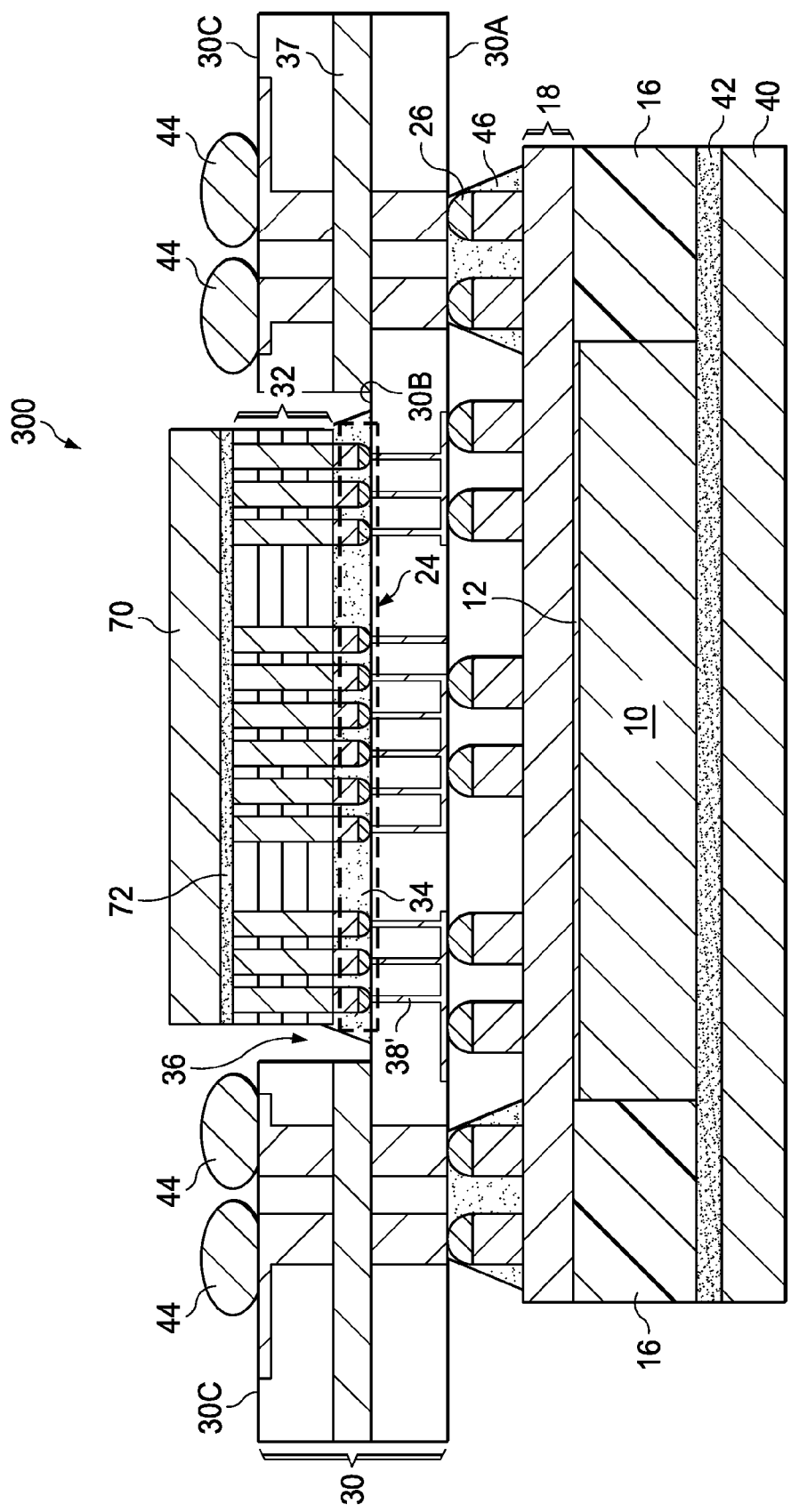

Subsequently, functional tests may be performed on package 300 prior to the attachment of dies 32. For example, electrical connections between die 10 and package substrate 30 may be tested. If package 300 passes the tests, dies 32 may be attached to package 300, for example, using connectors 24 formed as illustrated by FIG. 3D. Connectors 24 may be formed on dies 32 using any suitable method prior to attaching dies 32 to package 300. By performing functional tests on package 300 prior to the attachment of dies 32, dies 32 may be attached to only to known good packages. Packages that fail the functional tests may not have dies 32 attached thereto. Thus, cost savings may be incurred by avoiding attachment of dies 32 to failed packages.

Connectors 24 (e.g., microbumps) may be formed on dies 32 using any suitable method. Connectors 24 may be of a different size than connectors 26, and connectors 24 may be attached to contact pads on package substrate 30. Connectors 24 may be electrically connect dies 32 to die 10 through interconnect structures 38 in package substrate 30 (e.g., interconnect structures 38'), connectors 26, and RDLs 18.

Dies 32 may be disposed in cavity 36 of package substrate. In package 300, dies 32 and die 10 may be disposed on opposing sides of package substrate 30. Attaching dies 32 may include flipping package 300 (e.g., so that connectors 24 face upwards) and aligning dies 32 in cavity 36. A reflow may be performed on connectors 24 (e.g., to electrically connect dies 32 to die 10/package substrate 30), an underfill 34 may be dispensed around connectors 24.

The configuration of package 300 allows for a heat dissipation feature (e.g., heat dissipation feature 70) to be disposed on a surface dies 32. An interfacing material 72 may be disposed between heat dissipation feature 70 and dies 32, and interfacing material 72 may be in physical contact with dies 32. Heat dissipation feature 70 and interfacing material 72 may be substantially similar to heat dissipation feature 40 and interfacing material 42, respectively. Thus, an alternative manufacturing process may be used to form package 300.

Figure 5A:
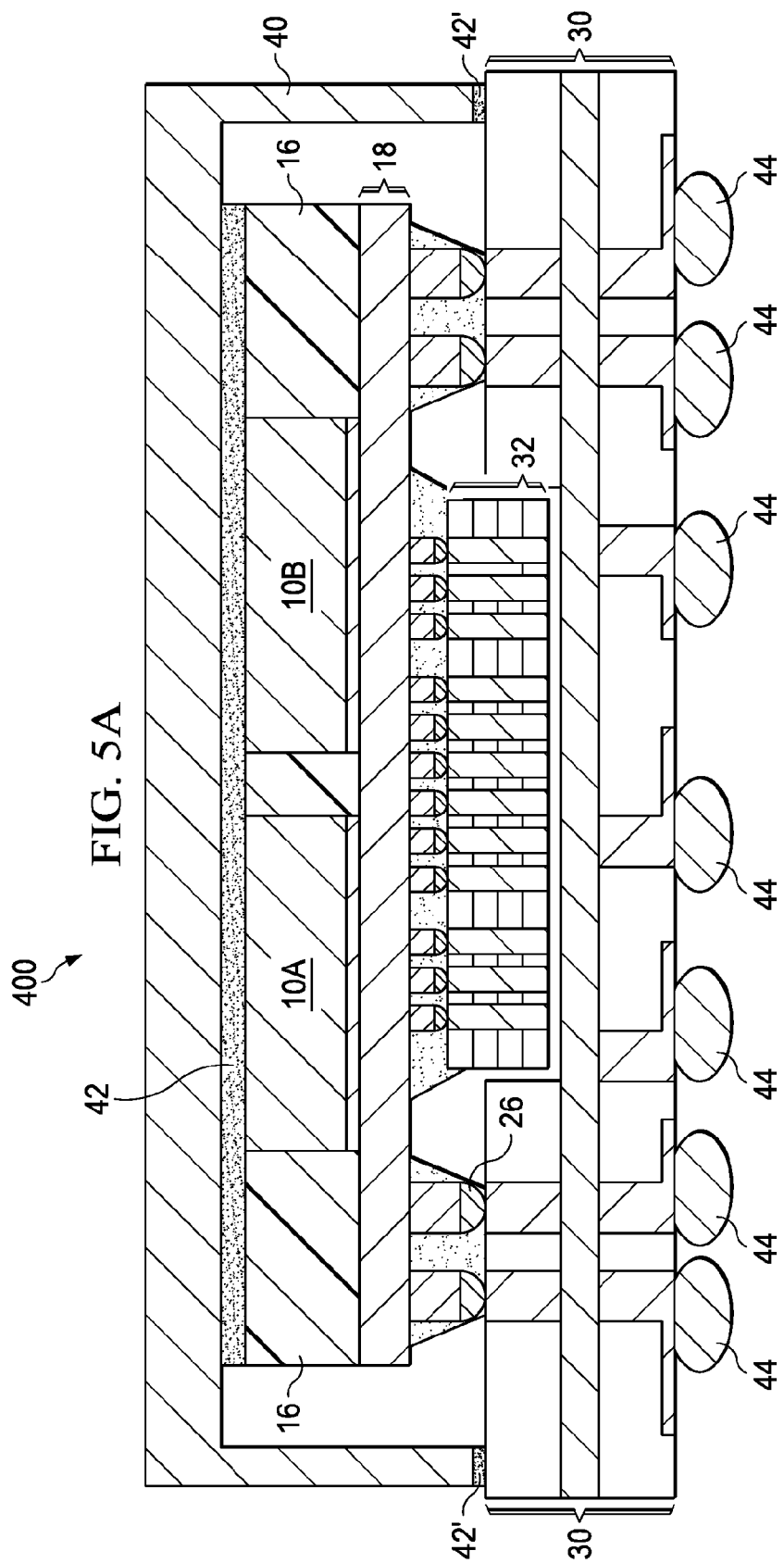
FIGS. 5A and 5B illustrate cross-sectional views of semiconductor packages in accordance with some alternative embodiments.
Figure 5B:
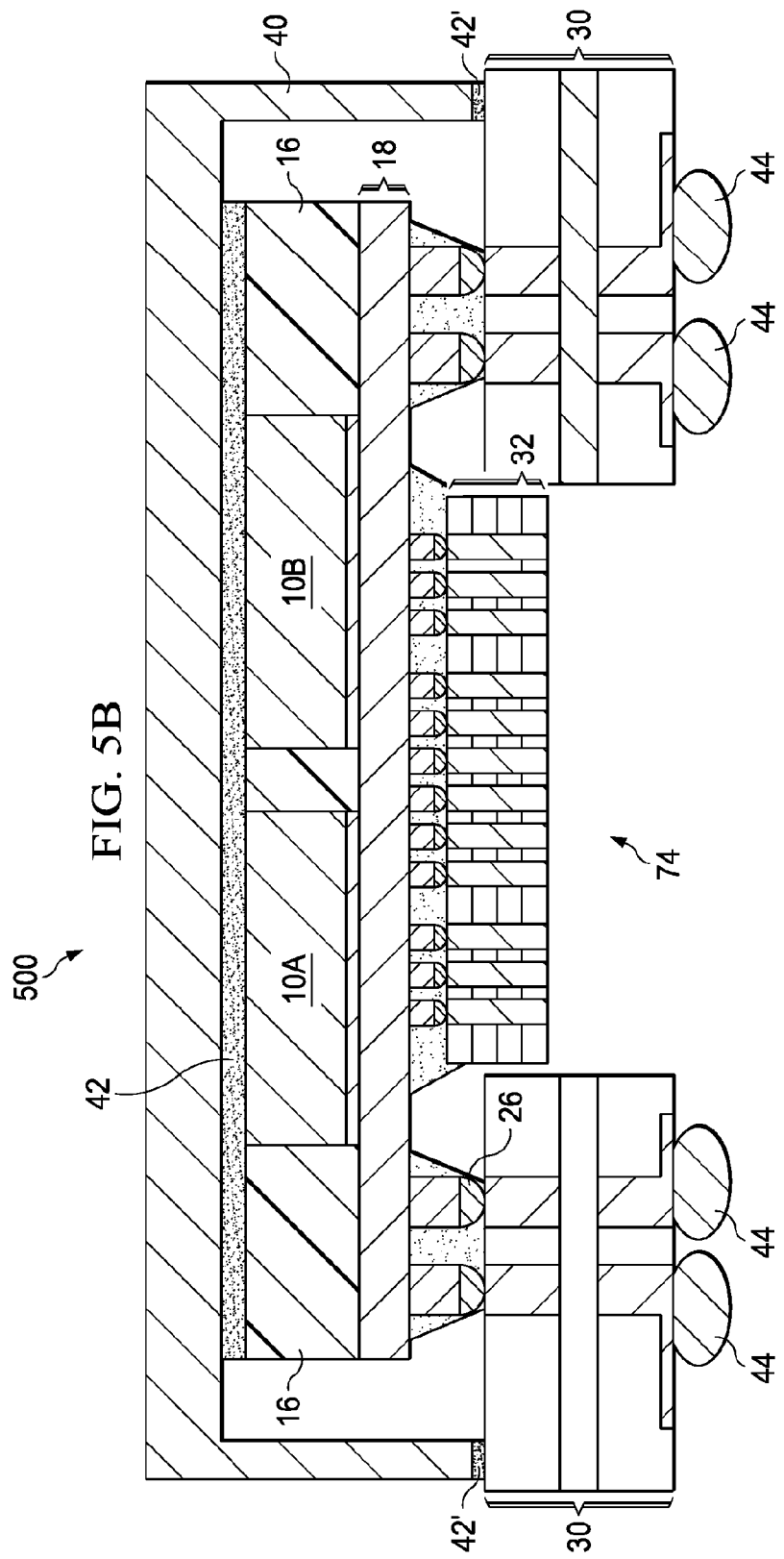

FIGS. 5A and 5B illustrate cross-sectional views of semiconductor packages 400 and 500, respectively. Packages 400 and 500 may be substantially similar to package 100 where like reference numerals represent like elements. However, packages 400 and 500 may further include multiple dies 10 (labeled 10A and 10B). Dies 10A and 10B may be part of a same fan-out package. For example, dies 10A and 10B may be surrounded by molding compound 14, and RDLs 18 may be formed on a surface of dies 10A and 10B. RDLs 18 may electrically connect dies 10A and 10B to dies 32. Furthermore, dies 10A and 10B may be substantially level. The formation of dies 10A and 10B may be substantially similar to the process illustrated in FIGS. 1A through 1J although singulation may be performed at different locations (e.g., scribe lines for a pick and place tool may be configured at different locations). In some embodiments, die 32 may be disposed in a cavity formed in substrate 30 (as illustrated by FIG. 5A). In other embodiments, die 32 may be disposed in a through-hole 74 in substrate 30 (as illustrated by FIG. 5B). Through-hole 74 may be formed in substrate 30, for example, using a laser drilling process.

Figure 6:
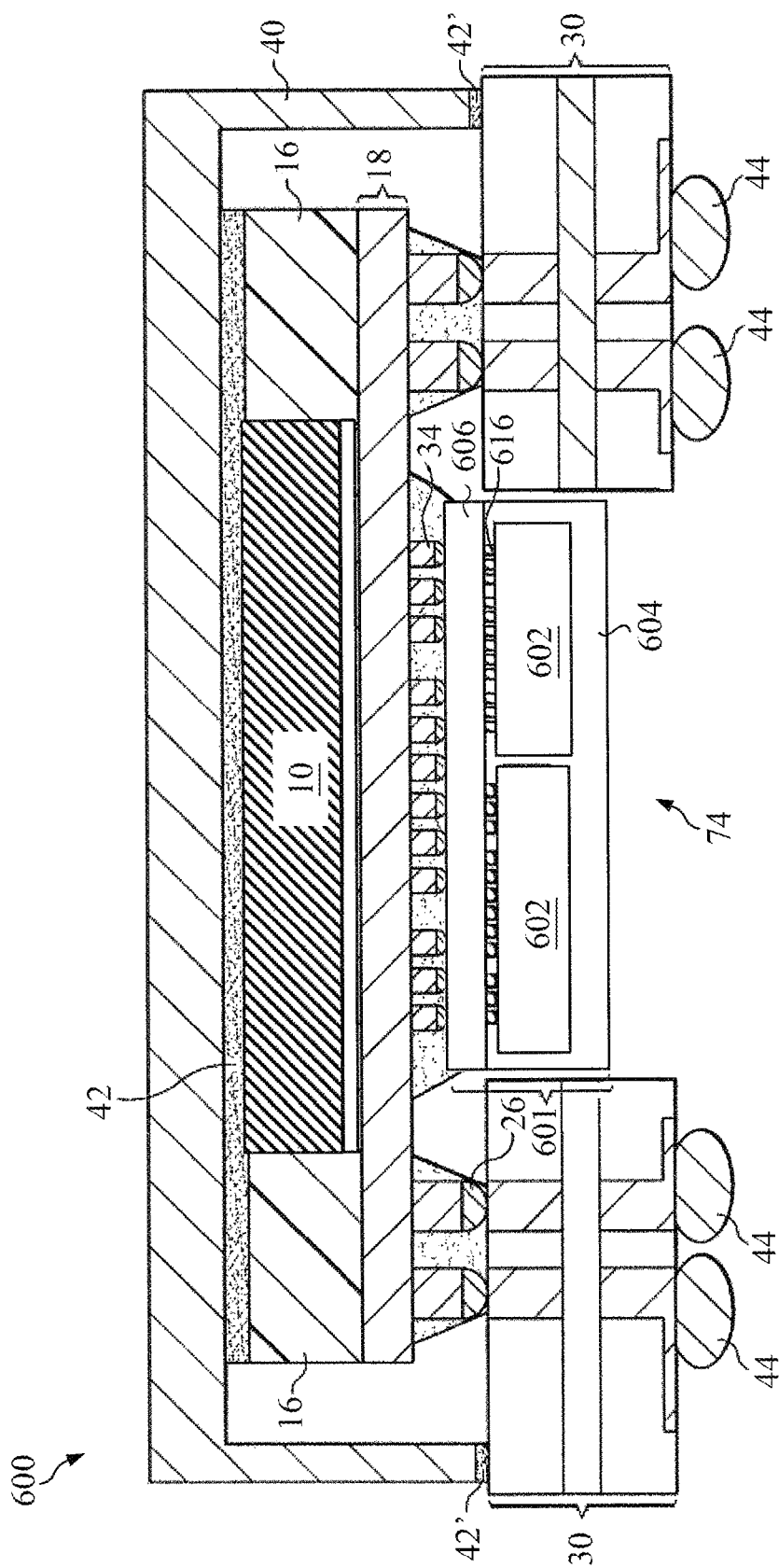
FIG. 6 illustrates a cross-sectional view a semiconductor package in accordance with some alternative embodiments.

FIG. 6 illustrates a cross-sectional view of a semiconductor package 600 in accordance with various embodiments. Package 600 may be substantially similar to package 100 where like reference numerals represent like elements. However, in package 600, die stacks 32 may be replaced with an integrated fan-out package 601. Package 601 includes a plurality of individual dies 602, which may be disposed laterally adjacent each other rather than stacked in a vertical configuration. Dies 602 may perform a same or different function as die 10. For example, in an embodiment, dies 602 may be memory dies (e.g., DRAM) while die 10 is a logic die. In the illustrated embodiment, a molding compound 604 is formed around and encases dies 602. In other embodiments (see e.g., FIG. 7G), dies 602 may be exposed by molding compound 604.

Package 601 may further include RDLs 606, and each die 602 may include connectors 616 electrically connecting dies 602 to RDLs 606. RDLs 606 may electrically connect dies 602 to die 10 and substrate 30. Furthermore, RDLs 606 may extend laterally past edges of dies 602, and RDLs 606 be used to route the electrical connections (e.g., functional circuitry) from dies 602 to connectors 34, which may be larger (e.g., have a greater pitch) than connectors 616. For example, connectors 34 may be C4 bumps or BGA balls having a relatively large pitch. In such embodiments, the use of larger C4 bumps or BGA balls to bond package 701 to other features of package 600 (e.g., RDLs 18) may result in better joint yield. In other embodiments, RDLs 606 may be omitted, and connectors 616 may be microbumps, which directly bond package 601 to other features of package 600.

In the illustrated embodiment, package 601 is at least partially disposed in a through-hole 74 of substrate 30, and package 601 is bonded to a surface of RDLs 18. Other configurations may also be used in other embodiments. For example, package 601 may be disposed in a cavity of substrate 30 rather than a through-hole (see e.g., cavity 36 of FIG. 1N). As another example, package 601 may be directly bonded to substrate 30 (see e.g., the configuration of package 300 in FIG. 3E).

Figure 7C:
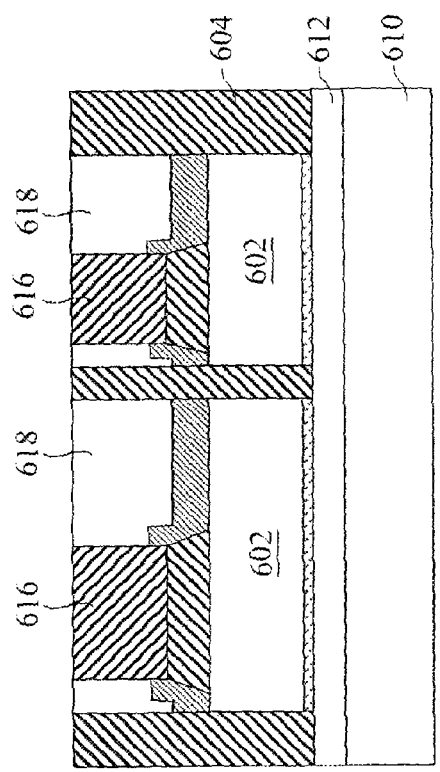

FIGS. 7A through 7F illustrate cross sectional views of intermediary steps of forming package 600 in accordance with some embodiments. Referring first to FIG. 7A, a cross sectional view of dies 602 attached to a carrier substrate 610 is provided. Dies 602 may be semiconductor dies as described above having, for example, a semiconductor substrate comprising active devices, interconnect layers electrically connecting various active devices to form functional circuits, contact pads 612, and a first passivation layer 614 covering edges of contact pads 612. Contact pads 612 act as input/output pads to the functional circuits in dies 602. FIG. 7A illustrates dies 602 as each having a single contact pad 612 for simplicity only, and the number of contact pads 612 in each die 602 may be much greater in practice.

In the embodiments illustrated by FIGS. 7A through 7F, dies 602 may further include conductive pillars 616 (e.g., comprising copper and the like) extending through an opening in passivation layer 614 to electrically connect to contact pad 612. A second passivation layer 618 (e.g., comprising a polymer) may be formed over passivation layer 614 and around conductive pillars 616. In other embodiments, conductive pillars 616/passivation layer 618 may be omitted. In still other embodiments, conductive pillars 616 may be replaced with another electrical connector (e.g., microbumps). Furthermore, while FIG. 7A illustrates two dies 602, other embodiments may include any number of dies 602 depending on package design. Dies 602 may be attached to a carrier 610 (e.g., using adhesive layers 608). A release film 612 may be disposed between dies 602 and carrier 610. In some embodiments, release film 612 comprises a light to heat conversion (LTHC) material, which may be activated to remove carrier 610 in subsequent process steps.

Next, in FIG. 7B, a molding compound 604 may be dispensed around dies 10. Suitable methods for forming molding compound 604 may include compressive molding, transfer molding, liquid encapsulent molding, and the like. For example, molding compound 604 may be dispensed between dies 602 in liquid form. A curing process may then be performed to solidify molding compound 604. Molding compound 604 may be dispensed to overflow and encase dies 602. Subsequently, a planarization process (e.g., CMP) may be used to remove excess portions of molding compound 604 and passivation layer 618 to expose conductive pillars 616 of dies 602 as illustrated by FIG. 7C.

Figure 7D:
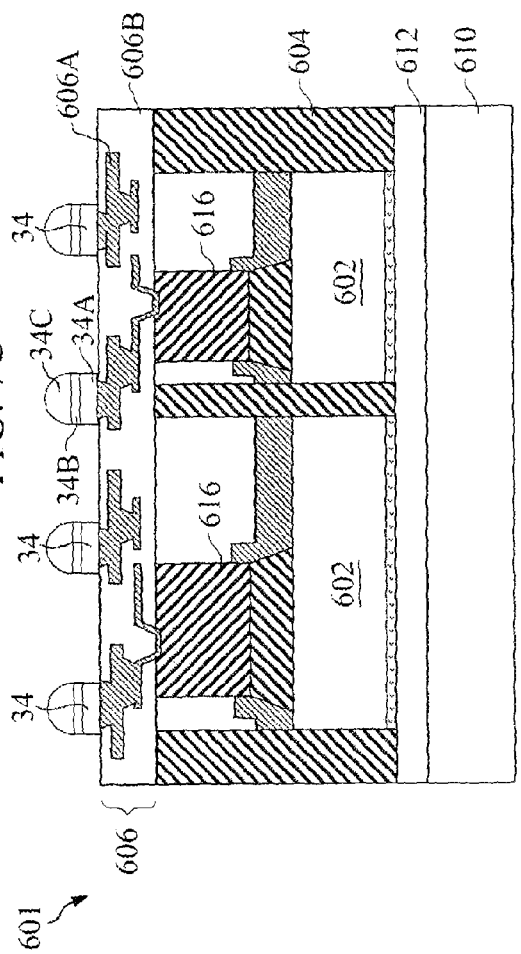

FIG. 7D illustrates the optional formation of RDLs 606 and connectors 34 over dies 602 and molding compound 604. As illustrated by FIG. 7D, RDLs 606 may extend laterally past edges of dies 602 over molding compound 604. RDLs 606 may include interconnect structures 606A formed in one or more polymer layers 606B. The formation of RDLs 606 may use substantially similar processes as RDLs 18. For example, the formation of interconnect structures 606A may include patterning polymer layers 606B (e.g., using a combination of photolithography and etching processes) and forming interconnect structures 606A (e.g., depositing a seed layer and using a mask layer to define the shape of interconnect structures 606A) in the patterned polymer layers 606B. Interconnect structures 606A may be electrically connected to conductive pillars 616 of dies 602.

As further illustrated by FIG. 7D, connectors 34 (e.g., used to subsequently bond RDLs 606 to RDLs 18) are formed using any suitable process. Although not illustrated in FIG. 7D. Connectors 34 may comprise multiple conductive layers. For example, in FIG. 7D connectors 34 include a copper portion 34A and a nickel portion 34B over the copper portion. In such embodiments, the bottom conductive portion (e.g., copper portion 34A) may first be formed, a second seed layer may be deposited over the bottom conductive portion, and the top conductive portion (e.g., nickel portion 34B) may be formed using an electrochemical plating process, for example. Subsequently, a solder region 34C comprising tin and silver solder, for example, may be formed over nickel portion 34B. Alternatively, connectors 34 may include any number of conductive layers and/or other conductive materials may also be used. Thus package 601 comprising dies 602 may be formed. Subsequently, carrier 610 may be removed, for example, by activating release film 612.

Figure 7E:
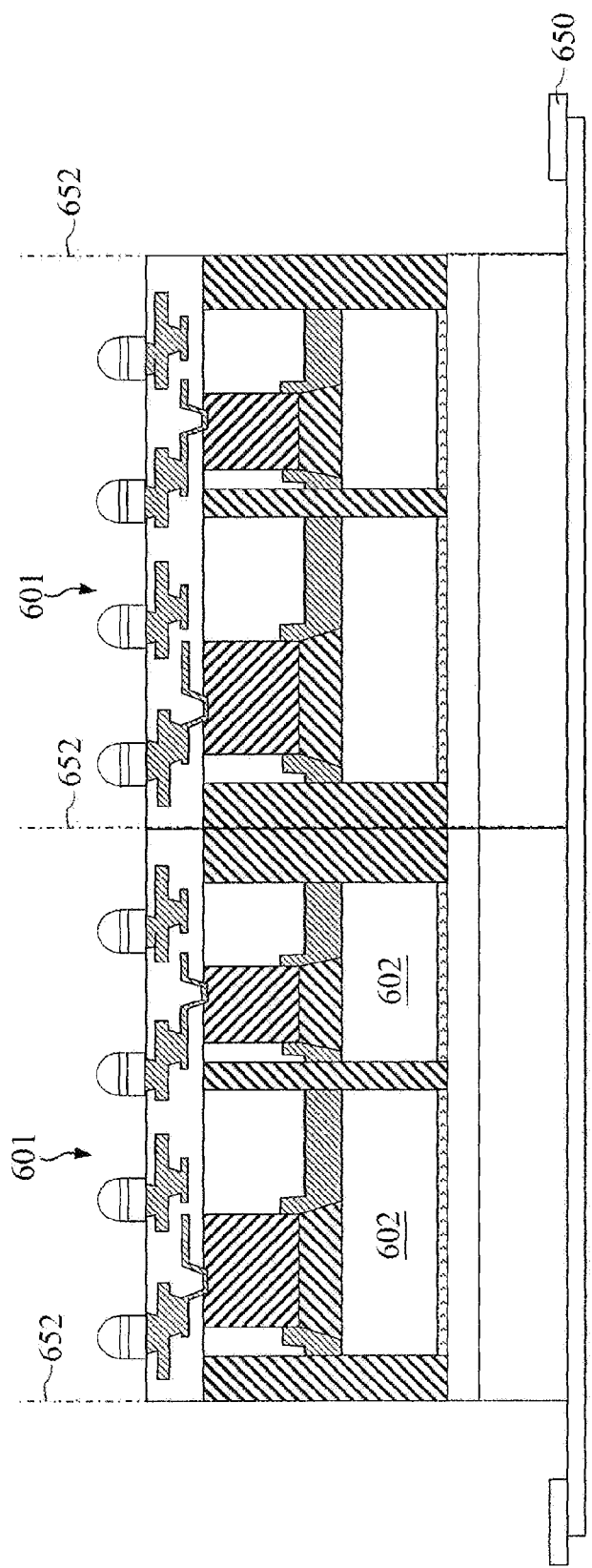

In some embodiments, package 601 may be formed as part of a larger substrate (e.g., a wafer), for example, comprising multiple packages 601. A singulation process may be applied to separate package 601 from other features (e.g., other packages) in the substrate. For example, FIG. 7E, illustrates a larger substrate comprising multiple packages 601 on a singulation tool 650 after the removal of carrier 610. Packages 601 may be separated along scribe lines at boundaries 652 using any suitable singulation tool.

Figure 7F:
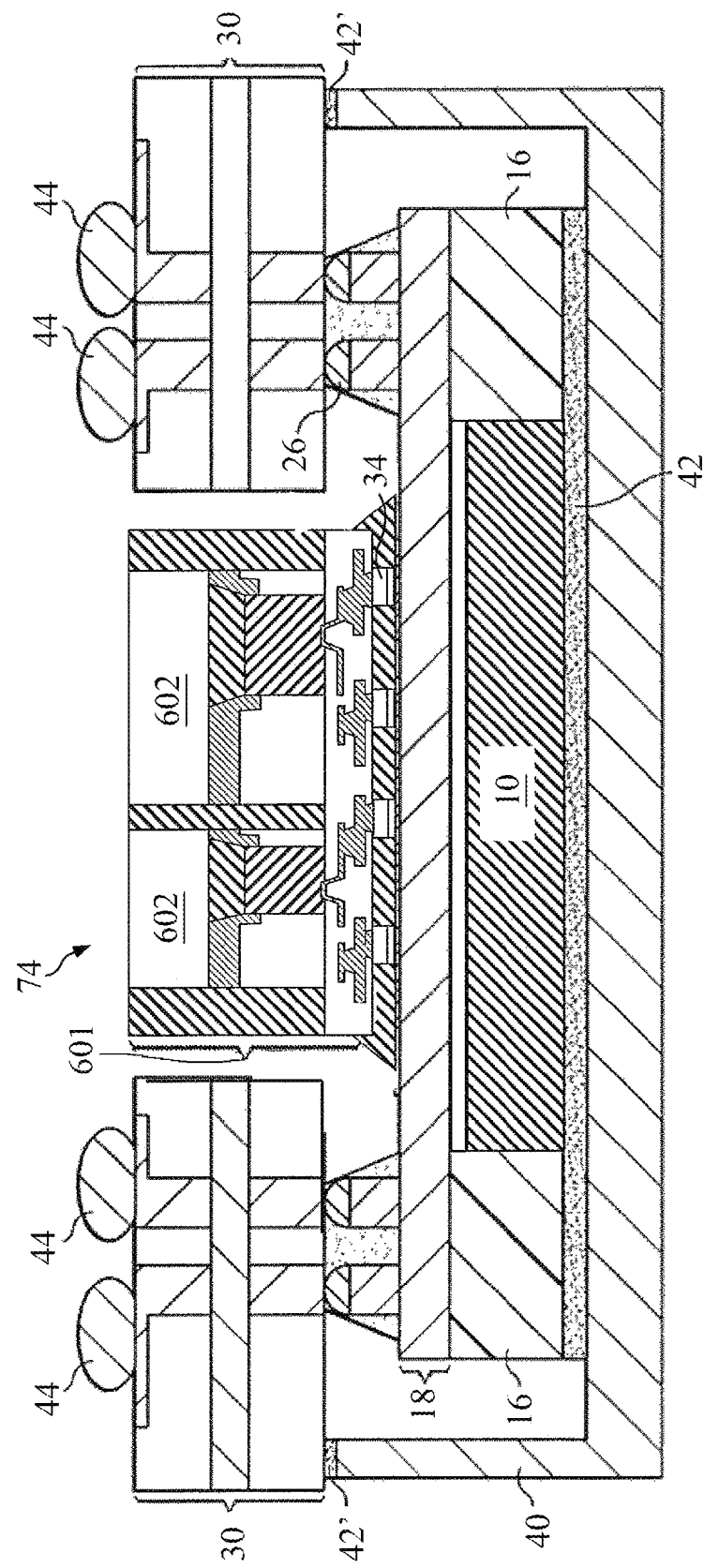

Subsequently, package 601 may be bonded to RDLs 18 as illustrated by FIG. 7F. As described above, package 601 may be partially disposed in through-hole 74 of substrate 30, and RDLs 18 may be used to electrically connect package 601 to die 10 and substrate 30. In other embodiments, package 601 may be disposed in a cavity 34 of package 30 rather than a through hole 74 (see e.g., the package configuration of FIG. 1N). In still other embodiments, package 601 and die 10/RDLs 18 may be disposed on opposing sides of substrate 30. In such embodiments, package 601 may be bonded to substrate 30 rather than RDLs 18 (see e.g., the package configuration of FIG. 3E).

Figure 8:
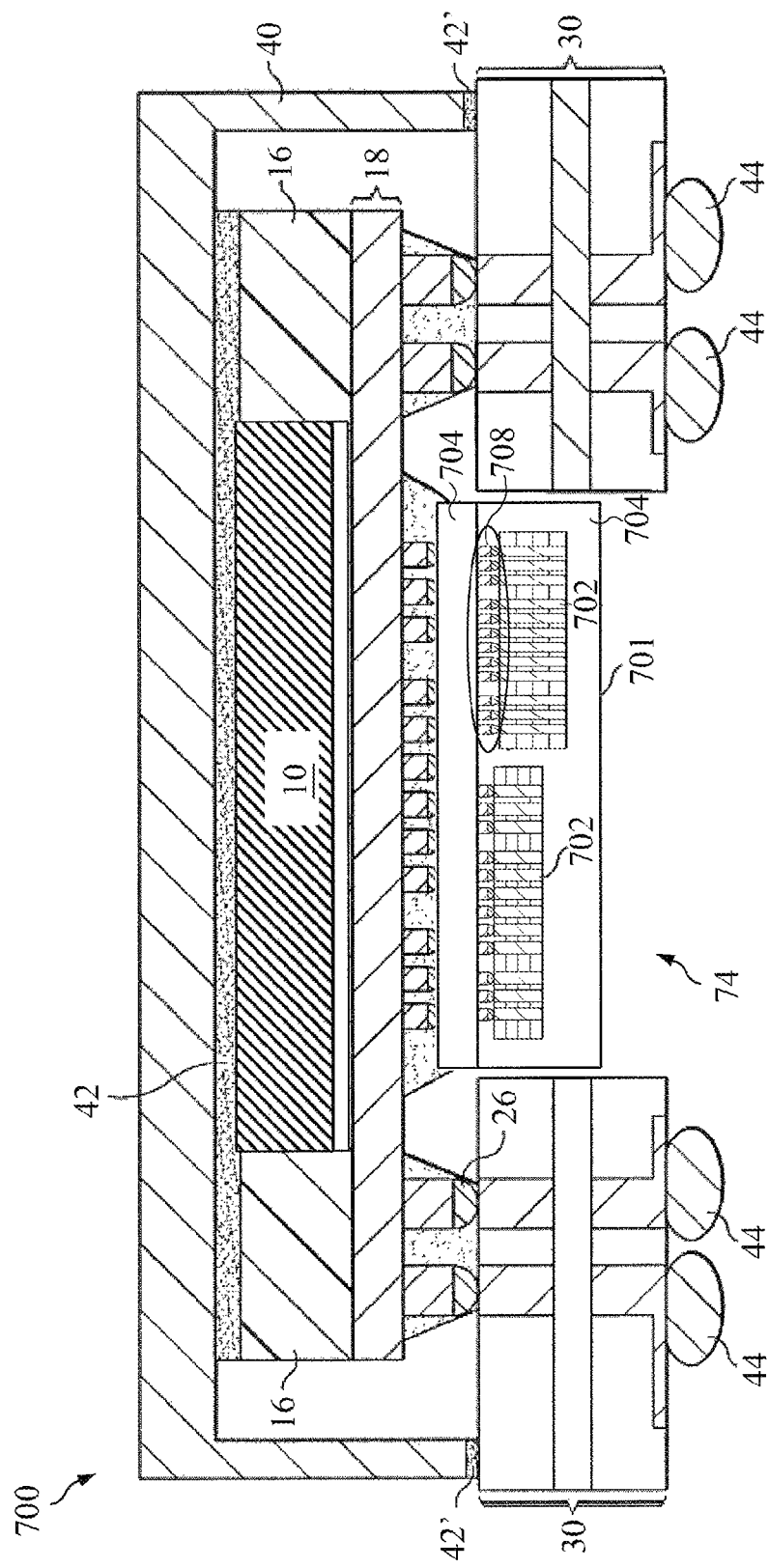
FIG. 8 illustrates a cross-sectional view a semiconductor package in accordance with some alternative embodiments.

FIG. 8 illustrates a cross-sectional view of a semiconductor package 700 in accordance with various alternative embodiments. Package 700 may be substantially similar to package 600 where like reference numerals represent like elements. Package 700 includes an integrated fan-out package 701 bonded to RDLs 18, die 10, and substrate 30. However, in package 701, individual dies 602 may be replaced with die stacks 702. In some embodiments, die stacks 702 may be a hybrid memory cube (HMC) although other die stack configurations may be used. Package 701 may include a plurality of die stacks 702 disposed laterally adjacent each other. A molding compound 704 may be formed around and encase die stacks 702 although in other embodiments (not illustrated), die stacks 702 may be exposed by molding compound 704.

Package 701 may further include RDLs 706, and each die stack 702 may include connectors 708 (e.g., microbumps) electrically connecting die stacks 702 to RDLs 706, which electrically connect die stacks 702 to die 10 and substrate 30. Furthermore, RDLs 706 may be used to route the electrical connections from connectors 708 to connectors 34, which may be larger than connectors 708. For example, connectors 616 may be microbumps while connectors 34 may be C4 bumps or BGA balls. In such embodiments, the use of C4 bumps or BGA balls rather than microbumps for direct connection to RDLs 18 may result in better joint yield. In other embodiments, RDLs 706 may be omitted, and connectors 708 may directly connect die stacks 702 to RDLs 18.

In the illustrated embodiment, package 701 is at least partially disposed in a through-hole 74 of substrate 30. Other configurations of substrate 30 may also be used in other embodiments. For example, any of the package configurations described above may be used, and package 701 may be disposed in a cavity of substrate 30 rather than a through-hole (see e.g., cavity 36 of FIG. 1N or 3E).

Figure 9:
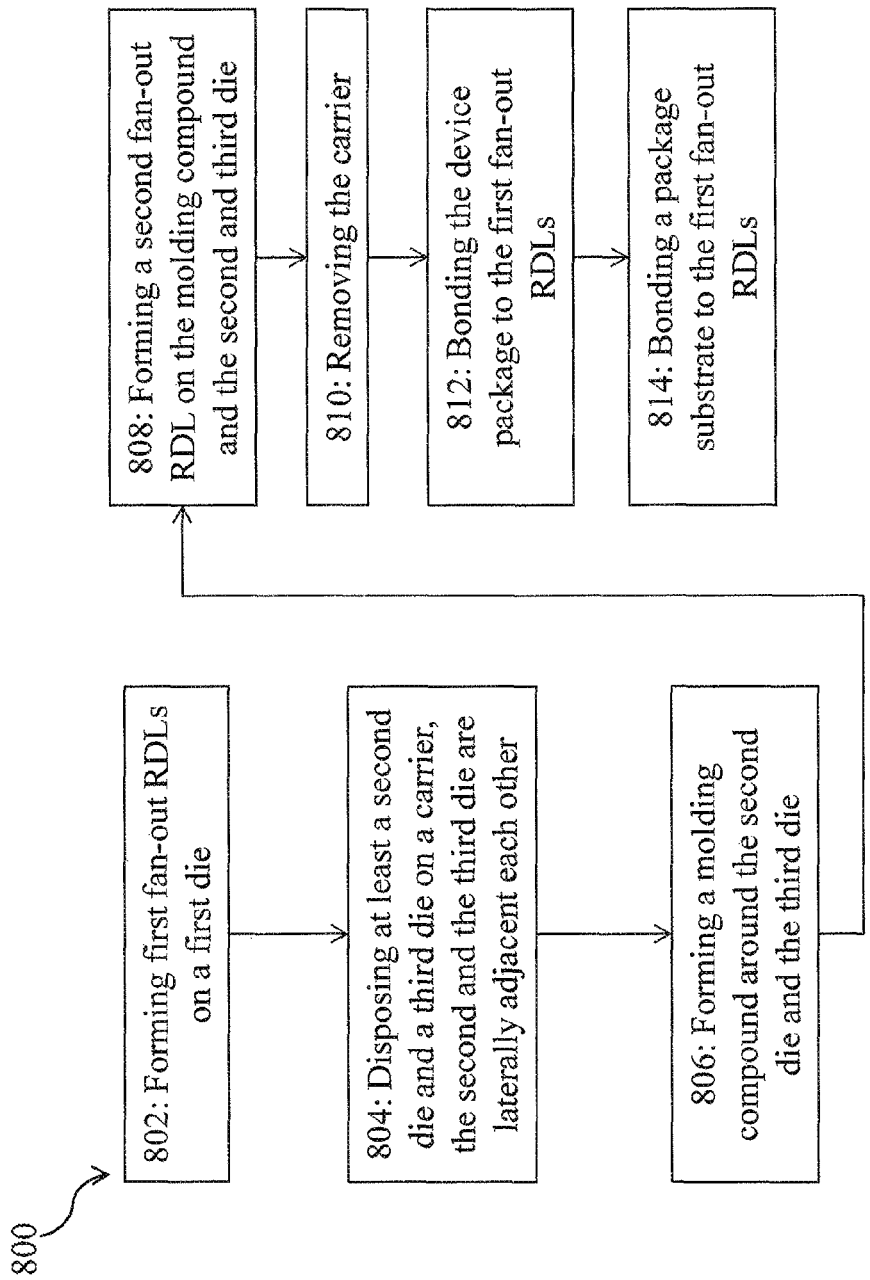
FIG. 9 illustrates a process flow for forming a semiconductor package in accordance with some embodiments.

FIG. 9 illustrates an example process 800 for forming an integrated circuit device (e.g., package 600/700) in accordance with some embodiments. Although process 800 shows a particular sequence of steps, in other embodiments, an alternate sequence may be used. In step 802, first fan-out RDLs (e.g., RDLs 18) are formed on a first die (e.g., die 10). The first fan-out RDLs may extend laterally past edges of the first die, for example, onto a molding compound (e.g., molding compound 16) encircling the first die. The first fan-out RDLs redistribute electrical signals from the first die to a larger surface area, thus increasing the number of input/output contacts available for bonding.

In steps 804 through 810 a device package (e.g., package 601) is formed. In step 804, two or more dies are disposed on a carrier (e.g., carrier 610). The two or more dies include at least a second die (e.g., die 602) and a third die (e.g., die 602) disposed laterally adjacent each other. In some embodiments, the second die and the third die are also part of die stacks (e.g., die stacks 702), each die stack having a plurality of vertically stacked dies. In step 806, a molding compound (e.g., molding compound 604) is formed around the two or more dies. Optionally, in step 808, second fan-out RDLs (RDLs 606) may be formed on the two or more dies and the molding compound. In step 810, the carrier may be removed. Subsequently, the device package may also be singulated along scribe lines from other features of a wafer.

In step 812, the device package is bonded to the first fan-out RDLs using a plurality of connectors (e.g., connectors 34). In embodiments where the device package includes the second fan-out RDLs, the plurality of connectors may be relatively large, e.g., C4 bumps or BGA balls. In such embodiments, the second fan-out RDLs redistribute the electrical connection from the dies in the device package to the connectors. In step 814, a package substrate (e.g., substrate 30) is also bonded to the first fan-out RDLs. The package substrate and the device package may be bonded to a same surface of the first fan-out RDLs. Furthermore, the package substrate may include a through-hole (e.g., through hole 74) or a cavity (e.g., cavity 36) with the device package at least partially disposed in the through hole or cavity.

Thus, as described above, a package substrate may include a cavity. A first die may be bonded to the package substrate. Where the cavity may be on the same side of the package substrate as the first die or on an opposing side of the package substrate as the first die. One or more second dies may be bonded to the package substrate and the first die, and the second dies may be disposed in the cavity. The second die may be bonded directly to the first die, or the second die may be bonded directly to the package substrate. Thus, the configuration of the package substrate allows for a package having a relatively thin form factor. Furthermore, the configuration of the dies in the package may allow for relatively simplistic heat dissipation elements to be attached to at least the first die.

In accordance with an embodiment, a device includes a first die, a first molding compound extending along sidewalls of the first die, and one or more first redistribution layers (RDLs) on the first die and the first molding compound. The device further includes a device package comprising a plurality of second dies, wherein the device package is bonded to an opposing surface of the one or more first RDLs as the first die and the first molding compound. A package substrate is bonded to the opposing surface of the one or more first RDLs. The package substrate is electrically connected to the first die and the plurality of second dies.

In accordance with another embodiment, a device includes a first die, first fan-out redistribution layers (RDLs) formed on the first die, and a device package bonded to an opposing side of the first fan-out RDLs as the first die. The first fan-out RDLs extend laterally past edges of the first die. The device package includes a second die, a third die disposed laterally adjacent the second die, and a molding compound extending along sidewalls of the second die and the third die. The device further includes a package substrate bonded to the first fan-out RDLs.

In accordance with yet another embodiment, a method includes forming one or more first fan-out redistribution layers (RDLs) on a first die and forming a device package. Forming the device package includes disposing a second die on a carrier, disposing a third die adjacent the second die on the carrier, forming a molding compound around the second die and the third die, and removing the carrier. The method further includes bonding the device package to the one or more first fan-out RDLs and bonding a package substrate to the one or more first fan-out RDLs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first die having contact pads on a surface of the first die;
   a first molding compound extending along sidewalls of the first die;
   one or more first redistribution layers (RDLs) on the first die and the first molding compound, the one or more first RDLs comprising conductive features formed in one or more polymer layers, the conductive features contacting the contact pads of the first die, the first molding compound coterminous with the one or more first RDLs;
   a device package comprising a plurality of second dies and one or more second RDLs, wherein the device package is bonded to an opposing surface of the one or more first RDLs as the first die and the first molding compound with first copper connectors extending from a first side of the one or more second RDLs, wherein the one or more second RDLs electrically connect each one of the plurality of second dies to the one or more first RDLs, wherein the one or more first RDLs extend laterally past edges of the one or more second RDLs, wherein the plurality of second dies each comprise second copper connectors contacting a second side of the one or more second RDLs opposite the first side of the one or more second RDLs, the first copper connectors being larger than the second copper connectors;
   a package substrate bonded to the opposing surface of the one or more first RDLs, wherein the package substrate is electrically connected to the first die and the plurality of second dies; and
   an underfill disposed between the one or more first RDLs and the one or more second RDLs, the underfill contacting the first copper connectors.

2. The device of claim 1, wherein the one or more second RDLs redistribute electrical connections from the plurality of second dies to the first copper connectors, the first copper connectors being a plurality of control collapse chip connection ($C_4$) bumps or a plurality of ball grid array (BGA) balls.

3. The device of claim 1, wherein the plurality of second dies comprises at least two dies disposed laterally adjacent each other.

4. The device of claim 1, wherein the plurality of second dies comprises at least two die stacks disposed laterally adjacent each other.

5. The device of claim 1, wherein the device package further comprises a second molding compound extending along sidewalls of the plurality of second dies, top surfaces of the second connectors being planar with a top surface of the second molding compound.

6. The device of claim 5, wherein the second molding compound at least partially encases the plurality of second dies.

7. The device of claim 5, wherein at least a surface of the plurality of second dies and the top surfaces of the second connectors are exposed by the second molding compound.

8. The device of claim 1, wherein the package substrate comprises a through hole, and the device package is at least partially disposed in the through hole, the through hole being round.

9. A device comprising:
   a first die comprising contact pads;
   first fan-out redistribution layers (RDLs) formed on the first die, the first fan-out RDLs comprising conductive features formed in one or more polymer layers, the conductive features contacting the contact pads of the first die, wherein the first fan-out RDLs extend laterally past edges of the first die;
   a first molding compound contacting the first fan-out RDLs and sidewalls of the first die, the first molding compound coterminous with the first fan-out RDLs;
   a device package bonded to an opposing side of the first fan-out RDLs as the first die with first connectors, wherein the device package comprises:
      a second die having a first surface and a second surface opposite the first surface, one or more first passivation layers on the first surface of the second die, the second die having second connectors smaller than the first connectors;
      a third die disposed laterally adjacent the second die, the third die having a first surface and a second surface opposite the first surface, one or more second passivation layers on the first surface of the third die, the third die having third connectors smaller than the first connectors;

a second molding compound extending along sidewalls of the second die and the third die, the second molding compound having a first surface and a second surface, the first surface of the second molding compound being level with top surfaces of the one or more first passivation layers and top surfaces of the one or more second passivation layers, the second surface of the second molding compound being level with the second surface of the second die and the second surface of the third die; and second fan-out RDLs connecting the second connectors and the third connectors to the first connectors;

an underfill between the first fan-out RDLs and the second fan-out RDLs, the underfill contacting the first connectors; and a package substrate bonded to the first fan-out RDLs.

10. The device of claim 9, wherein the second die is disposed in a first die stack comprising a first plurality of vertically stacked dies, wherein the third die is disposed in a second die stack comprising a second plurality of vertically stacked dies, and wherein the first die stack is disposed laterally adjacent the second die stack.

11. The device of claim 9, wherein the second fan-out RDLs extends laterally past edges of the second die and the third die, wherein the second fan-out RDLs physically contact the one or more first passivation layers and the one or more second passivation layers.

12. The device of claim 9, wherein the second fan-out RDLs redistribute electrical connections from the second die and the third die to the first connectors, the first connectors being a plurality of control collapse chip connection ($C_4$) bumps or a plurality of ball grid array (BGA) balls, and wherein the plurality of $C_4$ bumps or the plurality of BGA balls bonds the second fan-out RDLs of the device package to the first fan-out RDLs.

13. The device of claim 9, further comprising a through-hole extending through the package substrate, wherein the device package is at least partially disposed in the through-hole.

14. A method comprising:
forming a first molding compound around and on a first die;
planarizing the first molding compound to expose contact pads of the first die;
forming one or more first fan-out redistribution layers (RDLs) on the first die and the first molding compound, conductive features of the first fan-out RDLs contacting the contact pads of the first die;
forming a device package, wherein forming the device package comprises:
 disposing a second die on a carrier, the second die including first conductive pillars and a first passivation layer around the first conductive pillars;
 disposing a third die adjacent the second die on the carrier, the third die including second conductive pillars and a second passivation layer around the second conductive pillars;
 forming a second molding compound around the first passivation layer, the second passivation layer, the second die, and the third die;
 planarizing the second molding compound, the first passivation layer, and the second passivation layer to expose the first conductive pillars and the second conductive pillars;
 removing the carrier after the planarizing to expose back surfaces of the second die and the third die; and
 forming one or more second fan-out RDLs over the second die, the third die, and the second molding compound, wherein the one or more second fan-out RDLs are electrically connected to the first conductive pillars and the second conductive pillars;
bonding the one or more second fan-out RDLs of the device package to the one or more first fan-out RDLs with first connectors, the first connectors larger than the first conductive pillars and the second conductive pillars;
dispensing an underfill between the one or more first fan-out RDLs and the one or more second fan-out RDLs, the underfill contacting the first connectors; and
bonding a package substrate to the one or more first fan-out RDLs.

15. The method of claim 14, wherein the one or more second fan-out RDLs are electrically connected to the one or more first fan-out RDLs, wherein the one or more second fan-out RDLs extend laterally past edges of the second die and the third die.

16. The method of claim 15, wherein the first connectors are one of a plurality of control collapse chip connection ($C_4$) bumps or a plurality of ball grid array (BGA) balls connecting the one or more first fan-out RDLs to the one or more second fan-out RDLs.

17. The method of claim 14, wherein disposing the second die on the carrier comprises disposing a first die stack comprising the second die on the carrier, wherein disposing the third die on the carrier comprises disposing a second die stack comprising the second die on the carrier, and wherein the first die stack is disposed laterally adjacent the second die stack.

18. The method of claim 14, wherein the package substrate comprises a through-hole, and wherein bonding the device package comprises disposing the device package at least partially in the through-hole.

19. The method of claim 14, wherein bonding the device package and bonding the package substrate comprises bonding the device package and the package substrate to a same surface of the one or more first fan-out RDLs.

20. The device of claim 1, further comprising conductive connectors interjacent the package substrate and the opposing surface of the one or more first RDLs.

* * * * *